(12) United States Patent
Kuriyama

(10) Patent No.: US 6,480,427 B2
(45) Date of Patent: Nov. 12, 2002

(54) NEGATIVE-POTENTIAL DETECTING CIRCUIT HAVING AN ENHANCED SENSITIVITY OF DETECTING NEGATIVE POTENTIALS

(75) Inventor: Masao Kuriyama, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/789,712

(22) Filed: Feb. 22, 2001

(65) Prior Publication Data

US 2002/0039313 A1 Apr. 4, 2002

(30) Foreign Application Priority Data

Feb. 24, 2000 (JP) ........................................ 2000-048249

(51) Int. Cl.[7] ................................................. G11C 7/00
(52) U.S. Cl. ............................ 365/189.11; 365/185.18; 365/189.07; 327/540
(58) Field of Search ....................... 365/189.11, 185.18, 365/189.07, 189.01, 185.01; 327/540

(56) References Cited

U.S. PATENT DOCUMENTS 6,229,383 B1 * 5/2001 Ooishi ........................ 327/540

FOREIGN PATENT DOCUMENTS

JP 11312392 A 11/1999

OTHER PUBLICATIONS

M. Mihara et al., "A 29mm2 1.8V–only 16mb DINOR Flash Memory With Gate–Protected Poly–Diode (GPPD) Charge Pump", ISSCC99, Digest of Technical Papers, pp. 114–115, Feb. 1999.

* cited by examiner

Primary Examiner—Hoai Ho
(74) Attorney, Agent, or Firm—Banner & Witcoff, Ltd.

(57) ABSTRACT

A negative-potential detecting circuit includes first and second resistance elements connected in series between an output end of a constant-current source for outputting a constant current and a negative-potential node for generating a negative potential, a third resistance element connected between a connection node between the first and second resistance elements and a fixed-potential node, and a comparator for comparing a potential of a connection node between the constant-current source and the first resistance element and a reference potential with each other. The comparator detects a level of a negative potential by comparing the potential of the connection node and the reference potential.

19 Claims, 19 Drawing Sheets

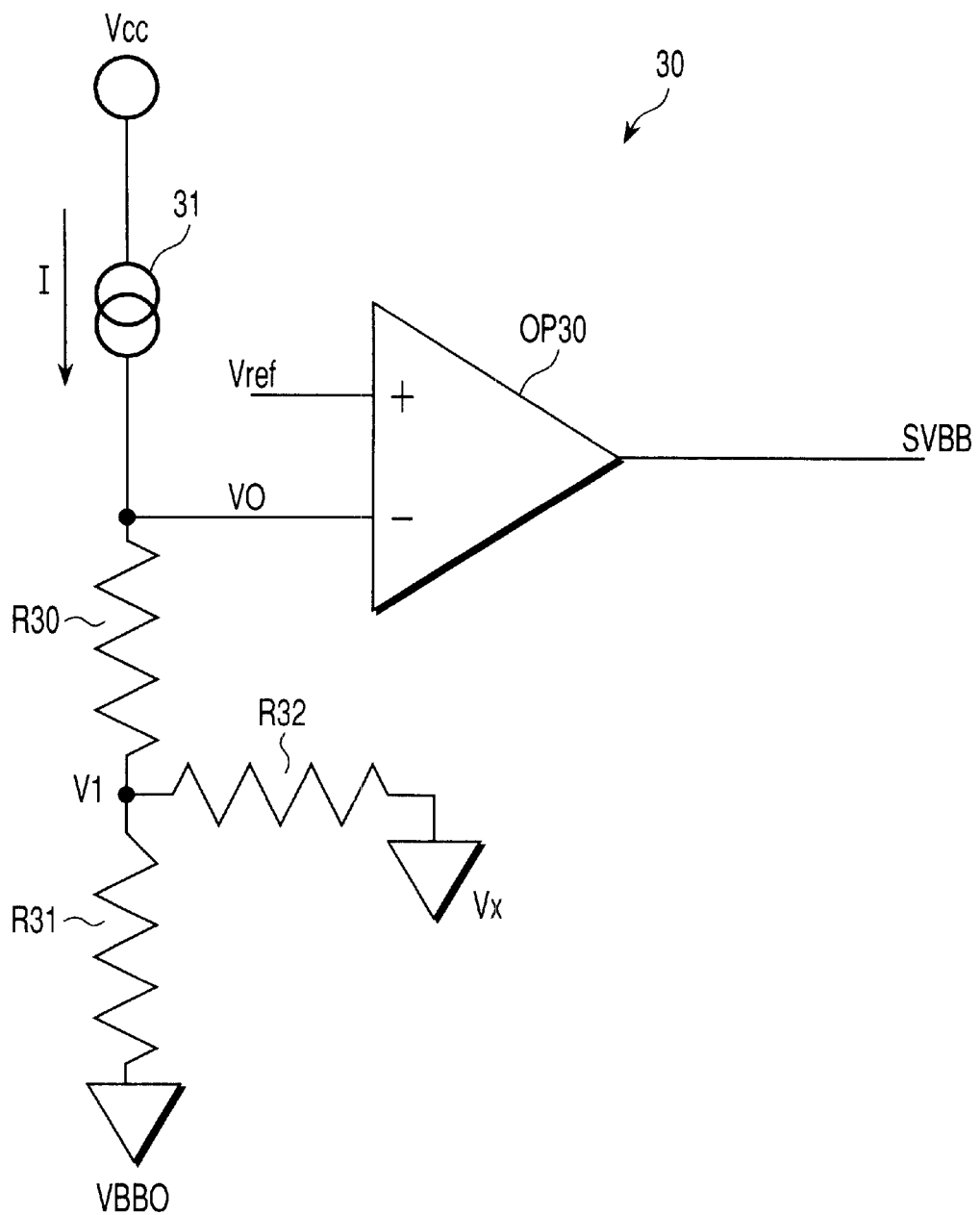
F I G. 3

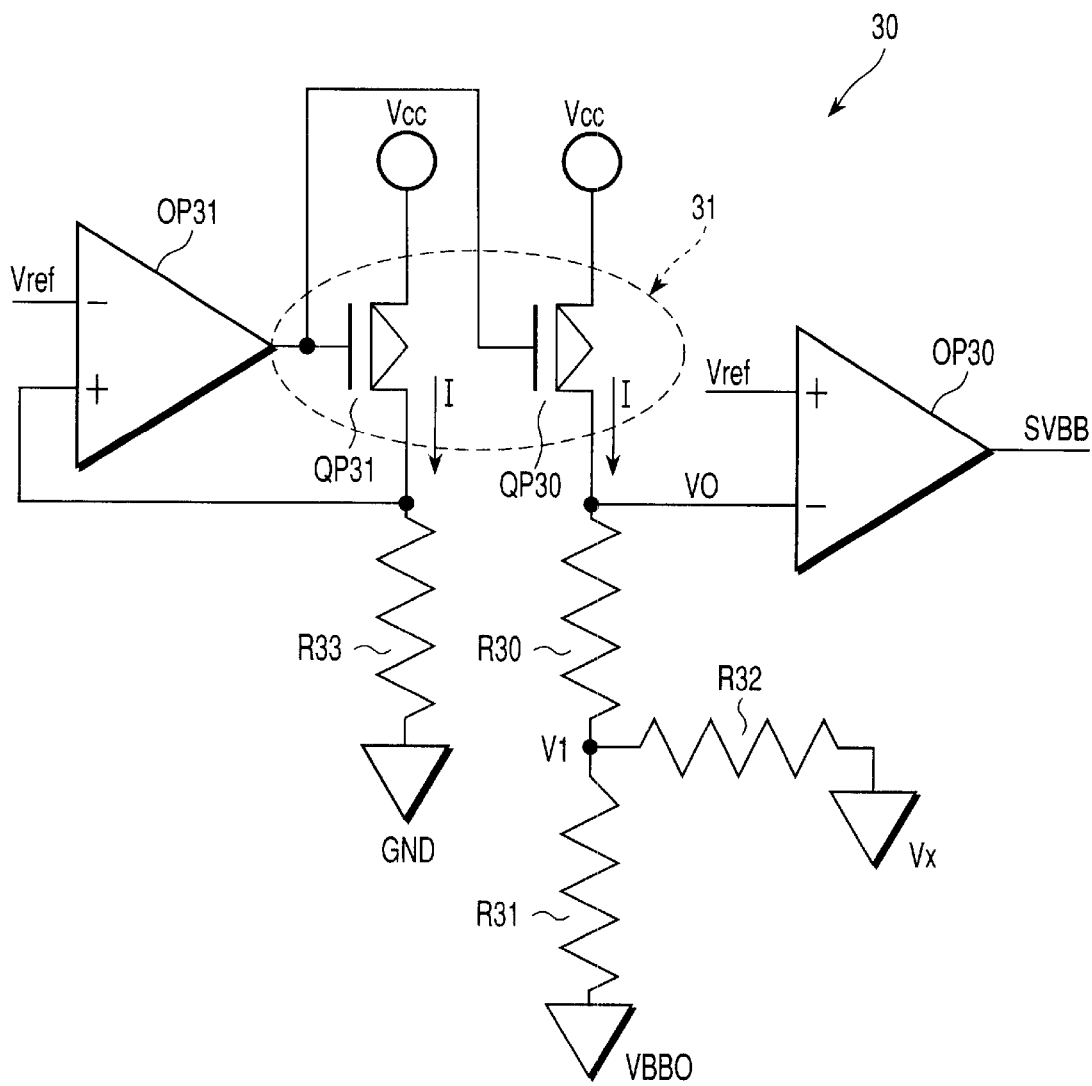
F I G. 4

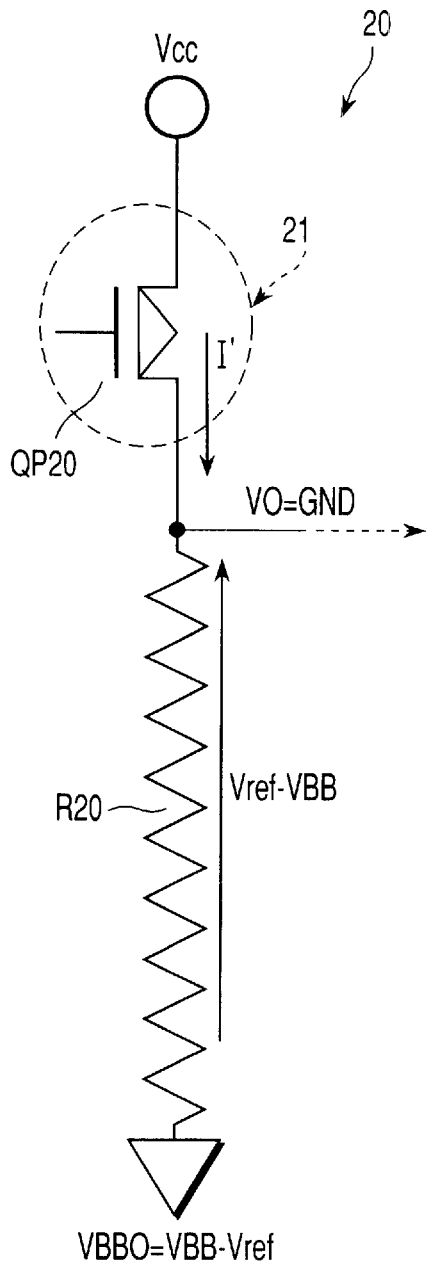
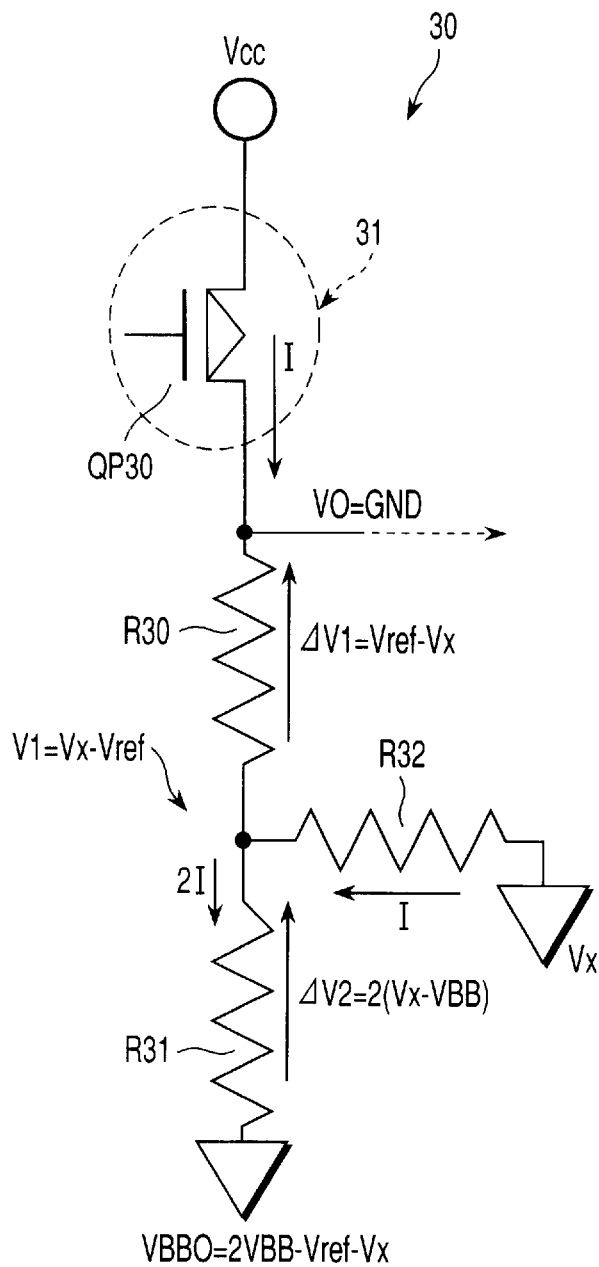
F I G. 6A  F I G. 6B

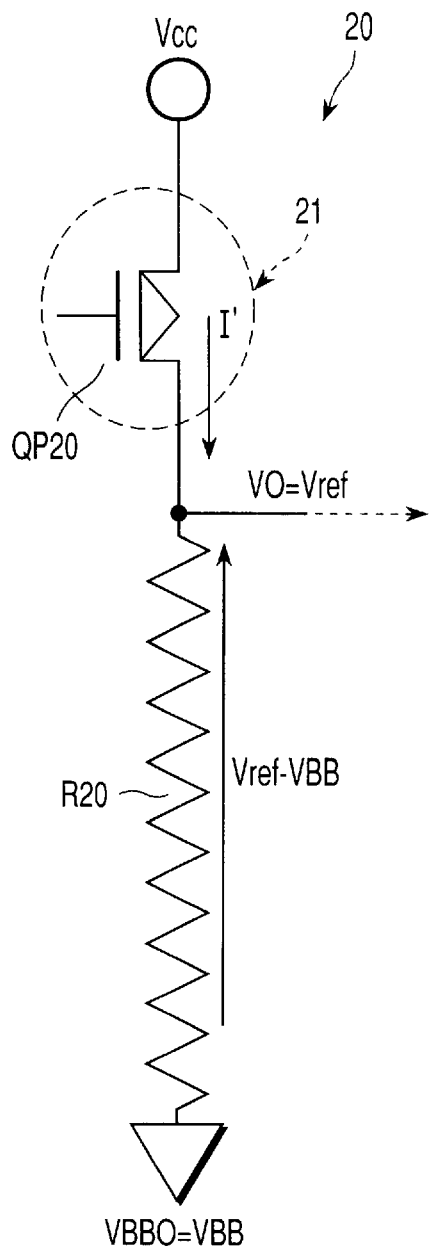
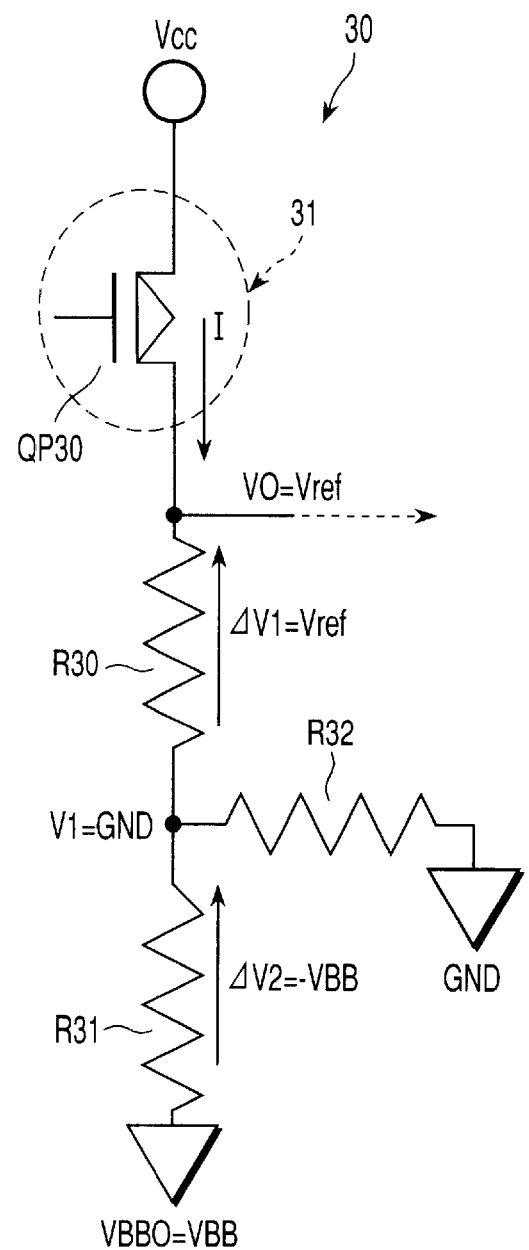
FIG. 9A
FIG. 9B

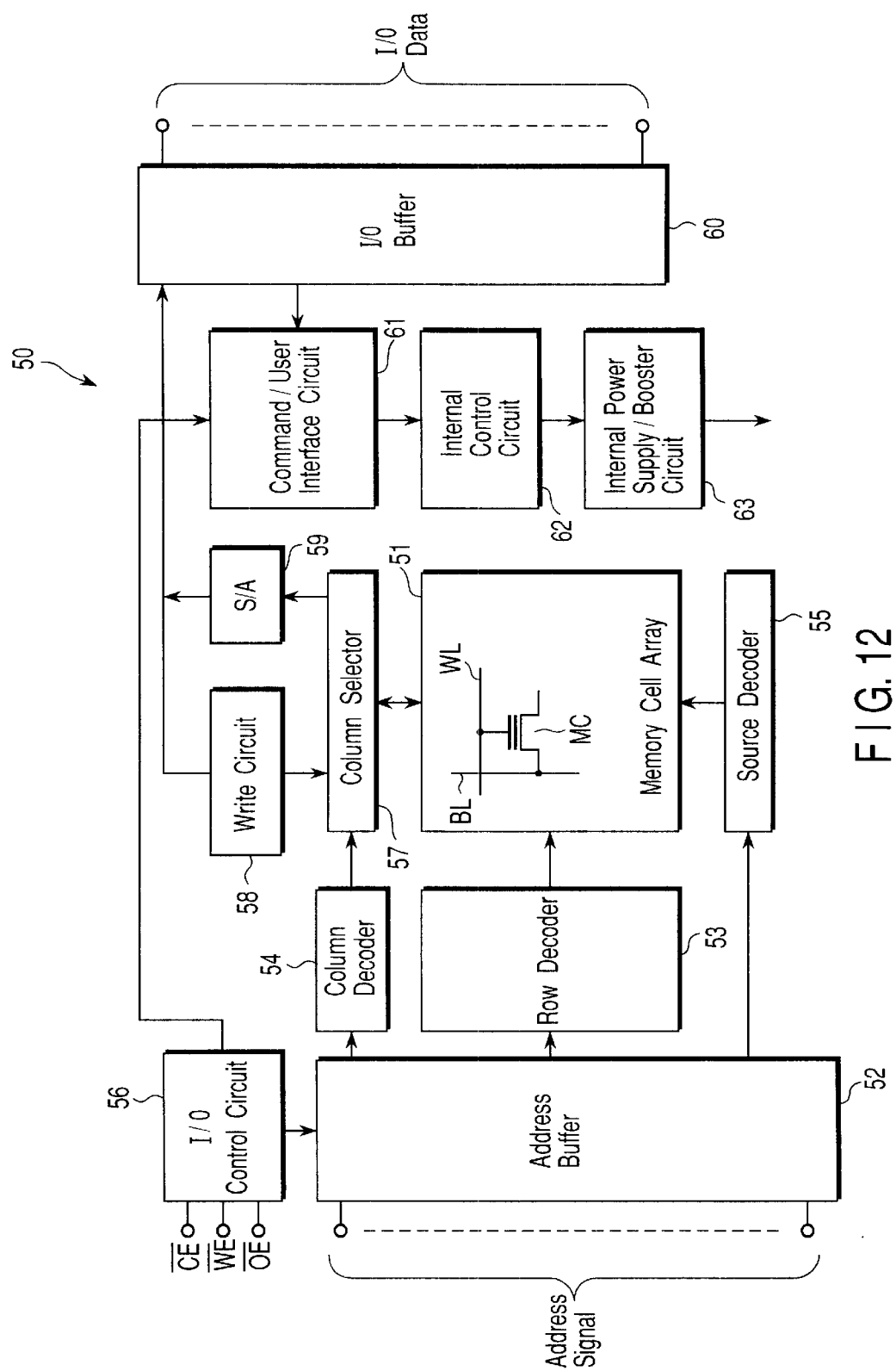
F I G. 12

|  | Gate Voltage Vg | Drain Voltage Vd | Source Voltage Vs |
| --- | --- | --- | --- |
| Write | 8V | 5V | 0V |
| Erase | -7V | Open | 5V |
| Read | 5V | 1V | 0V |

FIG. 13

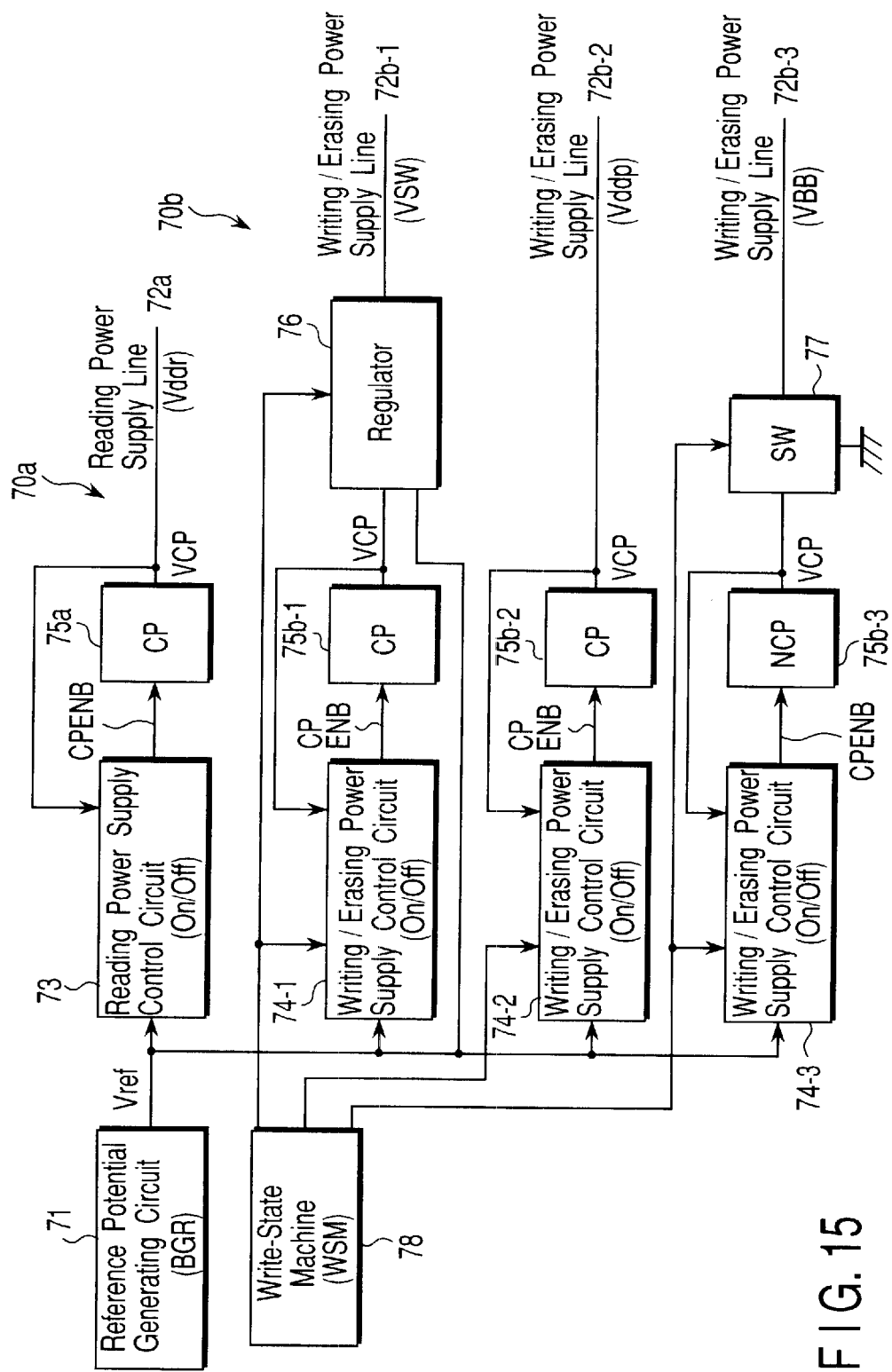
F I G. 15

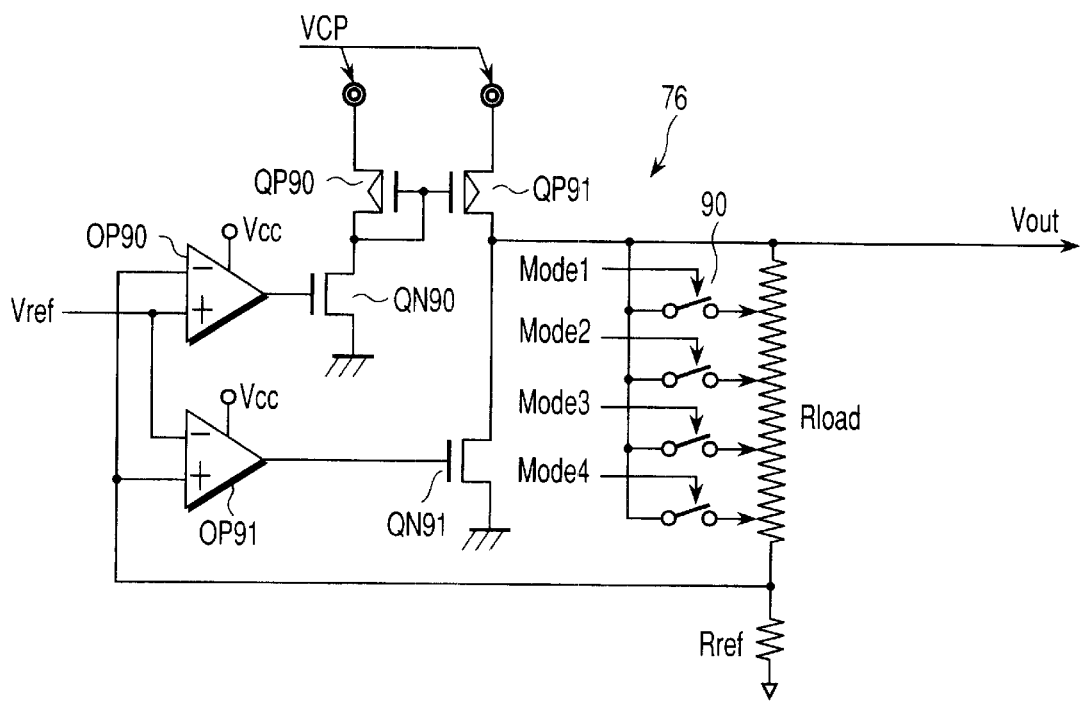
F I G. 17

NEGATIVE-POTENTIAL DETECTING CIRCUIT HAVING AN ENHANCED SENSITIVITY OF DETECTING NEGATIVE POTENTIALS

CROSS-REFERENCE TO RELATED APPLICATIONS

This application is based upon and claims the benefit of priority from the prior Japanese Patent Application No. 2000-048249, filed Feb. 24, 2000, the entire contents of which are incorporated herein by reference.

BACKGROUND OF THE INVENTION

The present invention relates to a negative-potential detecting circuit and a semiconductor memory device. More specifically, the present invention relates to a negative-potential detecting circuit for use in a power supply system of a semiconductor memory device.

A prior art negative-potential detecting circuit will now be described with reference to FIG. 1. As FIG. 1 shows, a negative-potential detecting circuit 10 includes resistance elements R10 and R11 and an operational amplifier OP10. One end of the resistance element R10 is connected to a VP power supply for applying a fixed positive potential VP to a semiconductor chip. One end of the resistance element R11 is connected to the other end of the resistance element R10, and the other end thereof is connected to a negative-potential power supply for generating a negative potential VBBO. The operational amplifier OP10 has an inverted input terminal (−) that receives a potential VO from a node between the resistance elements R10 and R11 and a non-inverted input terminal (+) that receives a reference potential Vref. The operational amplifier OP10 compares the reference potential Vref and the potential VO with each other and detects whether the negative potential VBBO reaches a desired level.

In the prior art negative-potential detecting circuit with the above arrangement, if the resistance elements R10 and R11 have their respective resistances r10 and r11, the potential VO applied to the operational amplifier OP10 is expressed by the following equation:

$$VO=VBBO+(r11/(r10+r11))\cdot(VP-VBBO)$$

The resistances r10 and r11 are so determined that the potential VO becomes equal to the reference potential Vref when the negative potential VBBO reaches a desired potential VBB. Thus, the output SVBB of the operational amplifier OP100 is inverted when the negative potential VBBO reaches VBB. This inversion makes it possible to detect that the negative potential VBBO reaches the desired potential VBB.

However, the prior art negative-potential detecting circuit shown in FIG. 1 has the following problems:

(1) The precision in detecting the levels is obtained from r11/(r10+r11) of the above equation and it is not higher than 1. Since the potential VO depends on the potential-dividing ratio between the resistance elements R10 and R11, only part of the variation of the negative potential VBBO reflects the potential VO and the detection precision lowers.

(2) The use of the VP power supply increases the number of power supplies in the detecting circuit and thus complicates the circuit itself. Since the positive potential VP needs to be fixed, it is necessary to provide a VP power supply with a structure to charge an external power supply Vcc and keep it at a fixed potential, which complicates the detecting circuit. When a potential difference between VP and VBBO increases, it is likely to exceed the breakdown voltage of a diffusion layer constituting the resistance elements R10 and R11. For this reason, an intermediate potential between the positive and negative potentials VP and VBBO is applied forcibly to a well region surrounding the diffusion layer. A new power supply for applying the intermediate potential is required and the circuit arrangement is complicated accordingly.

(3) Since a transistor having a thick gate oxide and a high breakdown voltage is used in the detecting circuit, the detection sensitivity of the circuit lowers. This results from large variations of the potential VO with the negative potential VBBO. In some cases, the potential VO is set at a high potential close to the positive potential VP when the negative potential VBBO is at a GND level, and it is set at a negative potential lower than the reference potential Vref when the negative potential VBBO is at a highly negative potential. Thus, a transistor having a thick gate oxide and a high breakdown voltage should be used to constitute the operational amplifier OP10 such that it can cope with the case where the potential VO changes to a negative potential; accordingly, the detecting circuit decreases in detection sensitivity.

In order to resolve the above problems, a negative-potential detecting circuit is proposed in Mihara et al., "A 29 mm2 1.8 V-only 16 Mb DINOR Flash Memory with Gate-Protected Poly-Diode (GPPD) Charge Pump," ISSCC 99 Digest of Technical Papers, February, 1999, pp 114–115. FIG. 2 illustrates a negative-potential detecting circuit 20 as proposed in Mihara et al.

The negative-potential detecting circuit 20 includes a PMOS transistor QP20, a resistance element R20, and an operational amplifier OP20. The PMOS transistor QP20 has a source connected to an external power supply Vcc. One end of the resistance element R20 is connected to the drain of the PMOS transistor QP20, and the other end thereof is connected to a negative-potential power supply for generating a negative potential VBBO. The operational amplifier OP20 has an inverted input terminal (−) that receives a potential VO from a node between the drain of the PMOS transistor QP20 and the resistance element R20 and a non-inverted input terminal (+) that receives a reference potential Vref. The circuit 20 also includes a PMOS transistor QP21, a resistance element R21, and an operational amplifier OP21. The PMOS transistor QP21 has a source connected to an external power supply Vcc. One end of the resistance element R21 is connected to the drain of the PMOS transistor QP21, and the other end thereof is grounded. The operational amplifier OP21 has an inverted input terminal (−) that receives a potential VO from a node between the drain of the PMOS transistor QP21 and the resistance element R21 and a non-inverted input terminal (+) that receives a reference potential Vref. The output terminal of the operational amplifier OP21 is connected to the gates of the PMOS transistors QP20 and QP21.

In the above negative-potential detecting circuit so arranged, the node between the PMOS transistor QP21 and the resistance element R21 is maintained at the reference potential Vref. The PMOS transistors QP21 and QP20 thus serve as a constant-current source 21 for supplying a constant current I' (=Vref/r21:r21 is a resistance of the resistance element R21). If a desired detection level of the negative potential VBBO is VBB, the resistance r20 of the resistance element R20 is expressed as follows: r20=(1 −VBB/Vref)·r21. Thus, the voltage VO at the node between the drain of the PMOS transistor QP20 and the resistance element R20 is given as follows: VO=VBBO+Vref−VBB.

Assuming that the desired detection potential VBB is −2.5 V and the reference potential Vref is 1.25V, −VBB/Vref is 2 and thus r20 becomes equal to 3r21. Considering a voltage drop in the resistance element R20, R20·I' is 1.25 V and thus 3r20 ·I' becomes equal to 3.75V. If the potential VO=1.25V= Vref, the negative potential VBBO must be −2.5 V that is equal to the desired detection potential VBB.

The above negative-potential detecting circuit of Mihara et al. has the following advantages over the circuit shown in FIG. 1:

(1) The precision of the detection level is 1 (=ΔVO/ ΔVBBO). The precision is high because the potential VO is directly influenced by variations of the negative potential VBBO.

(2) Since no VP power supplies are required, the circuit arrangement can be simplified and the problem of a breakdown voltage of a diffusion layer constituting the resistance elements can be resolved.

The upper limit of the potential VO is Vcc. In some cases, however, the lower limit of the potential VO depends upon the negative potential VBBO and becomes very negative. A transistor having a thick gate oxide and a high breakdown voltage should be used to constitute the constant-current source 21 receiving the potential VO and the operational amplifier OP20. In this case, the sensitivity of detection may decrease.

BRIEF SUMMARY OF THE INVENTION

A negative-potential detecting circuit according to an aspect of the present invention comprises:
a constant-current source;
a first resistance element having one end connected to an output node of the constant-current source and another end;
a second resistance element having one end connected to said another end of the first resistance element and another end connected to a negative-potential node whose potential is to be detected;
a first comparator having one input terminal connected to a connection node between the constant-current source and the first resistance element, another input terminal connected to a first reference potential node for setting a detection level of a potential of the negative-potential node, and an output terminal, which compares a potential of the connection node and a first reference potential of the first reference potential node with each other to determine a voltage level of the negative-potential node; and
a third resistance element having one end connected to a connection node of each of the first and second resistance elements and another end connected to a second reference potential node.

A semiconductor memory device according to an aspect of the present invention comprises:
a booster circuit which receives a power supply voltage from outside, generates a negative boost potential used for at least one of writing, reading, and erasing of stored data of a memory cell array in response to an internal control signal, and applies the negative boost potential to any one of a row decoder, a column decoder, and a source decoder; and
a control circuit which controls the negative boost potential applied to any one of the row decoder, the column decoder, and the source decoder from the booster circuit, the control circuit including a negative-potential detecting circuit,
wherein the negative-potential detecting circuit includes:
a constant-current source;
a first resistance element having one end connected to an output node of the constant-current source;
a second resistance element having one end connected to another end of the first resistance element and another end connected to a negative boost potential node whose potential is to be detected;
a comparator having one input terminal connected to a connection node between the constant-current source and the first resistance element and another input terminal connected to a first reference potential node setting a detection level of the negative boost potential, which compares a potential of the connection node and a first reference potential of the first reference potential node with each other to determine a voltage level of the negative boost potential node; and
a third resistance element having one end connected to a connection node of each of the first and second resistance elements and another end connected to a second reference potential node.

A negative-potential detecting circuit according to a second aspect of the present invention comprises:
a constant-current source;
a potential-dividing circuit provided between the constant-current source and a negative-potential node whose potential is to be detected, for dividing a potential difference between an output terminal of the constant-current source and the negative-potential node to generate a divided potential;
a comparator for comparing a potential of a detection node between the potential-dividing circuit and the constant-current source and a first reference potential for setting a detection level with each other to determine a level of a negative potential of the negative-potential node; and
a potential control circuit provided between an output node of the potential-dividing circuit for outputting the divided potential and a second reference potential, for when a potential of the negative-potential node varies, controlling a potential of the output node of the potential-dividing circuit to hold the potential of the detection node at a positive value.

A semiconductor memory device according to a third aspect of the present invention comprises:
a booster circuit which receives a power supply voltage from outside, for generating a negative boost potential used for at least one of writing, reading, and erasing of stored data of a memory cell array in response to an internal control signal, and applying the negative boost potential to any one of a row decoder, a column decoder, and a source decoder; and
a control circuit for controlling the negative boost potential applied to any one of the row decoder, the column decoder, and the source decoder from the booster circuit, the control circuit including a negative-potential detecting circuit,
wherein the negative-potential detecting circuit includes:
a constant-current source;
a first resistance element having one end connected to an output node of the constant-current source;
a second resistance element having one end connected to another end of the first resistance element and another end connected to a negative boost potential node whose potential is to be detected;

a comparator having one input terminal connected to a connection node between the constant-current source and the first resistance element and another input terminal connected to a first reference potential node for setting a detection level of the negative boost potential, for comparing a potential of the connection node and a first reference potential of the first reference potential node with each other to determine a voltage level of the negative boost potential node; and a third resistance element having one end connected to a connection node of each of the first and second resistance elements and another end connected to a second reference potential node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram of a negative-potential detecting circuit according to a first embodiment of the present invention;

FIG. 4 is a specific circuit diagram of the negative-potential detecting circuit according to the first embodiment of the present invention;

FIGS. 5A and 6A are circuit diagrams each showing part of the prior art negative-potential detecting circuit;

FIGS. 5B and 6B are circuit diagrams each showing part of the negative-potential detecting circuit according to the first embodiment of the present invention;

FIGS. 9A and 10A are circuit diagrams each showing part of the prior art negative-potential detecting circuit;

FIGS. 9B and 10B are circuit diagrams each showing part of the negative-potential detecting circuit according to the second embodiment of the present invention;

FIG. 12 is a block diagram of a nonvolatile semiconductor memory according to one embodiment of the present invention;

FIG. 13 is a table showing operating voltages of the gate, drain and source of a memory cell in write, erase and read modes in the nonvolatile semiconductor memory according to the one embodiment of the present invention;

FIG. 15 is a circuit diagram of a reading power supply and writing/erasing power supplies in the nonvolatile semiconductor memory according to the one embodiment of the present invention;

FIG. 17 is a circuit diagram of a regulator control circuit in the nonvolatile semiconductor memory according to the one embodiment of the present invention;

DETAILED DESCRIPTION OF THE INVENTION

Figure 1:
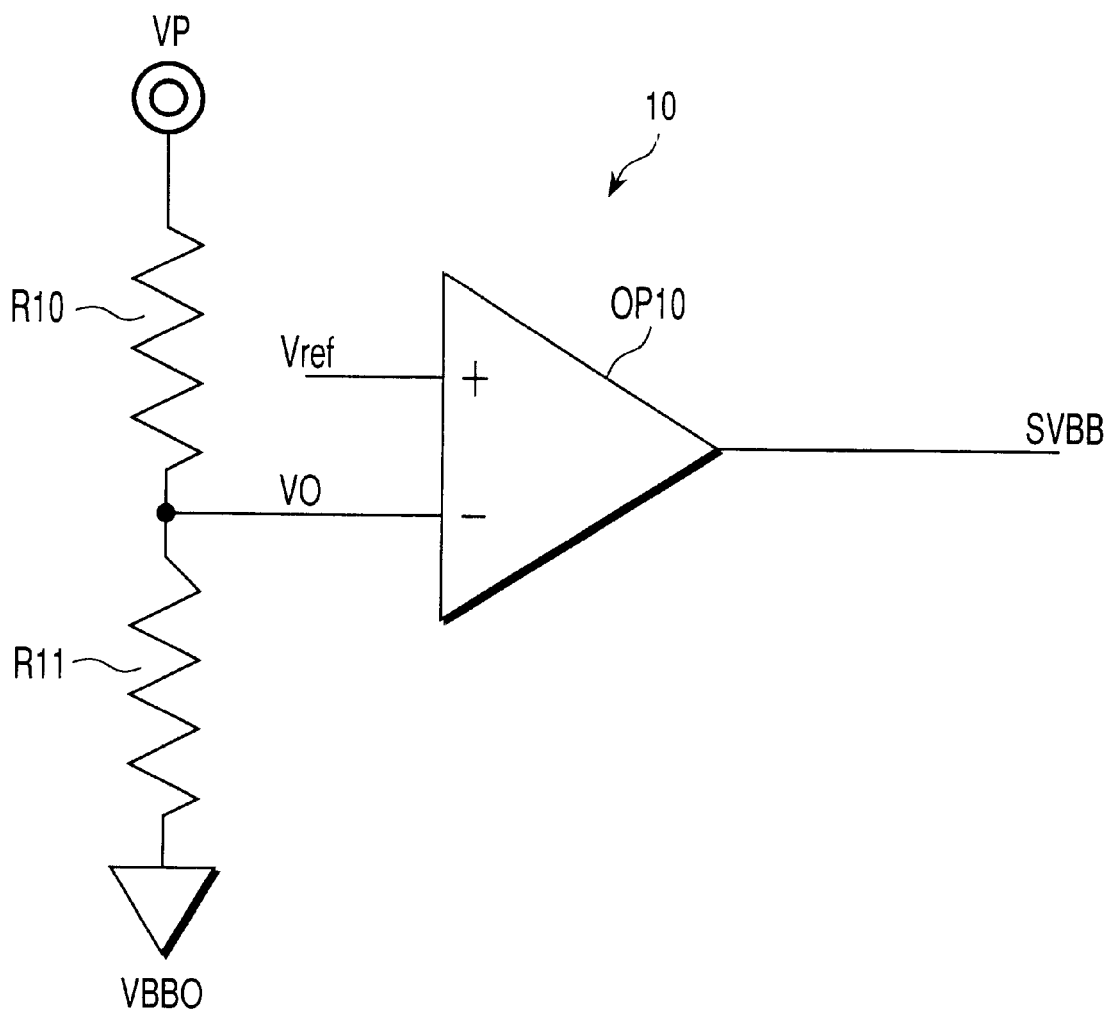
FIG. 1 is a circuit diagram of a prior art negative-potential detecting circuit.
Figure 2:
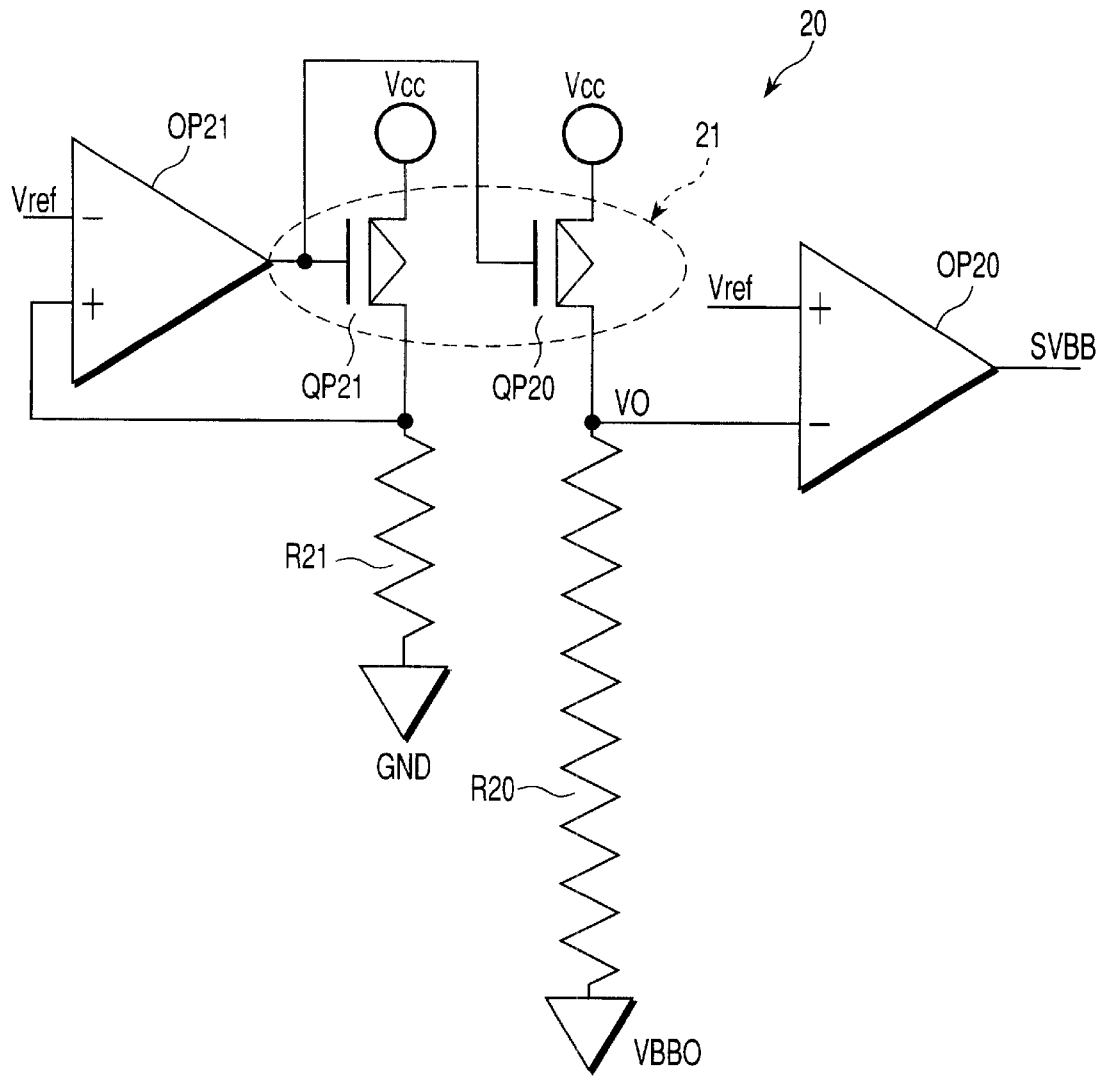
FIG. 2 is a circuit diagram of another prior art negative-potential detecting circuit.

FIG. 3 is a circuit diagram of a negative-potential detecting circuit according to a first embodiment of the present invention.

As FIG. 3 shows, the negative-potential detecting circuit 30 includes a constant-current source 31, a first resistance element R30, a second resistance element R31 (which constitutes a potential-dividing circuit together with the first resistance element R30), a third resistance element R32 (potential control circuit), and an operational amplifier OP30 (first comparator). The constant-current source 31 outputs a constant current $I$ upon receipt of an external power supply voltage Vcc. One end of the first resistance element R30 is connected to an output terminal of the constant-current source 31. One end of the second resistance element R31 is connected to the other end of the first resistance element R30, and the other end thereof is connected to a negative-potential power supply for generating a negative potential VBBO. One end of the third resistance element R32 is connected to a node (detection node) between the first and second resistance elements R30 and R31, and the other end thereof is connected to a reference power supply for generating a fixed potential Vx (second reference potential). The operational amplifier OP30 has an inverted input terminal (−) connected to a node between the constant-current source 31 and the resistance element R30 and a non-inverted input terminal (+) connected to a reference power supply for generating a fixed potential Vref (first reference potential).

Assume that a desired one of negative potentials VBBO generated from the negative-potential power supply is VBB (detection level). The ratio of resistance r30 of the resistance element R30 to resistance r31 of the resistance element R31 is set to (Vref−Vx):(Vx−VBB). The operational amplifier OP30 compares a potential VO at the node between the resistance element R30 and the constant-current source 31 with the reference potential Vref and outputs a comparison result SVBB. It is thus detected whether the potential VBBO generated from the negative-potential power supply reaches a desired detection level VBB.

FIG. 4 is a specific circuit diagram of the negative-potential detecting circuit shown in FIG. 3.

As FIG. 4 shows, the constant-current source 31 is a PMOS transistor (first MOS transistor) QP30 having a source connected to an external power supply Vcc and a drain serving as an output terminal of current I. The negative-potential detecting circuit 30 also includes a PMOS transistor (second MOS transistor) QP31, a fourth resistance element R33, and an operational amplifier (second comparator) OP31. A circuit for controlling a value of the current supplied from the PMOS transistor QP30 is composed of the PMOS transistor QP31, the fourth resistance element R33, and the operational amplifier OP31. The PMOS transistor QP31 has a source connected to an external power supply Vcc. One end of the fourth resistance element R33 is connected to the drain of the PMOS transistor QP31 and the other end thereof is connected to a ground potential (GND). The operational amplifier OP31 has an inverted input terminal (−) connected to a reference power supply (third reference potential) for generating a fixed potential Vref and a non-inverted input terminal (+) connected to a node between the drain of the PMOS transistor QP31 and the fourth resistance element R33. The output of the operational amplifier OP31 controls the gate potentials of the PMOS transistors QP30 and QP31.

The PMOS transistor QP31 is also a constant-current source and supplies a constant current I of Vref/r33 if the resistance of the resistance element R33 is r33. The PMOS transistor QP30 supplies the same constant current I (=Vref/r33). As described above, the resistance ratio of the resistance element R30 to the resistance element R31 is (Vref−Vx):(Vx−VBB) and the constant current I supplied from the constant-current source 31 is Vref/r33. Thus, the resistances r30 and r31 of the resistance elements R30 and R31 are expressed by the following equations:

$$r30 = (Vref - Vx) \cdot r33 / Vref$$

$$r31 = (Vx - VBB) \cdot r33 / Vref$$
$$= (Vx - VBB) \cdot r30 / (Vref - Vx)$$

The constant current I is expressed as follows:

$$I = Vref/r33 = (Vref - Vx)/r30$$

If the PMOS transistor QP30 can supply the above constant current I, a circuit for controlling a value of the current I is not limited to the circuit arrangement shown in FIG. 4.

Figure 5A:
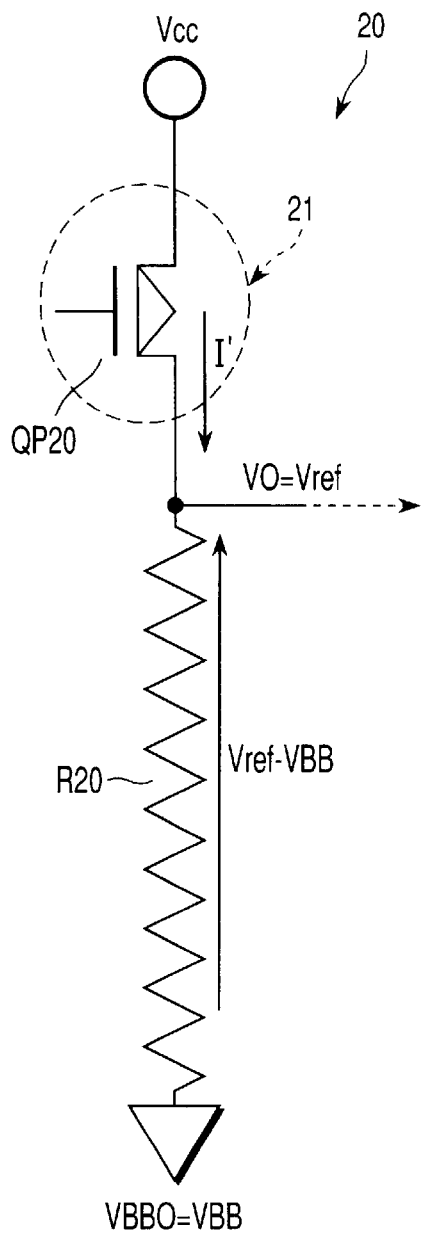
Figure 5B:
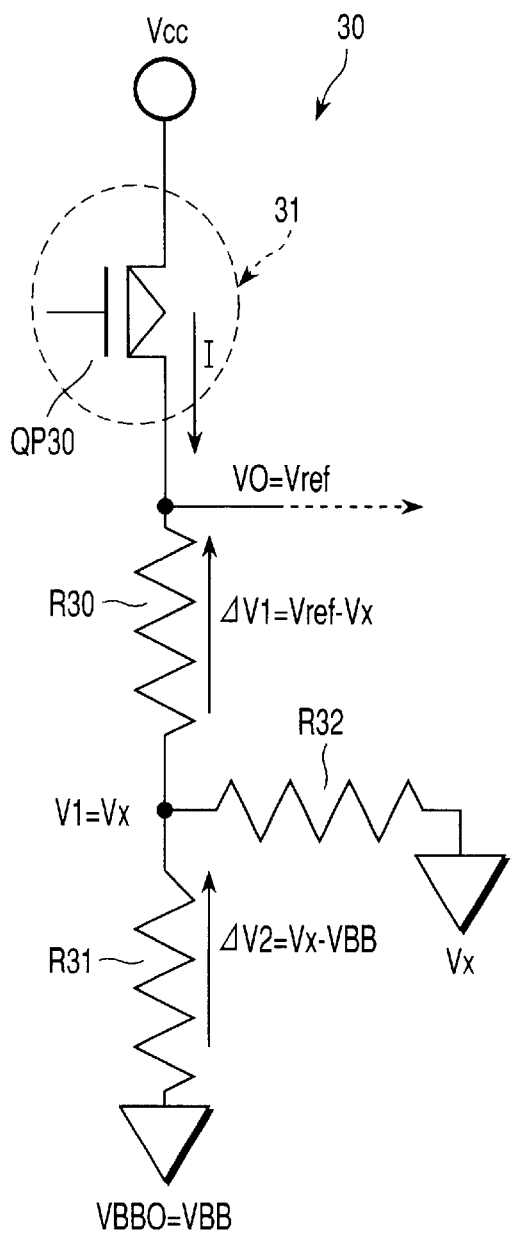

An operation of the negative-potential detecting circuit according to the first embodiment and its advantage will now be discussed as compared with those of the prior art circuit of Mihara et al. FIG. 5A is a circuit diagram of the negative-potential detecting circuit proposed by Mihara et al., and FIG. 5B is also a circuit diagram of the negative-potential detecting circuit of the first embodiment of the present invention. These figures show only the main parts of the circuits for the sake of simplification.

In the negative-potential detecting circuit 30 of the present invention, the resistance element R20 of the circuit 20 of Mihara et al. (resistance r20 =(1+(−VBB/Vref))·r21) is divided into two resistance elements R30 and R31 having a resistance ratio of (Vref−Vx):(Vx−VBB), and the resistance element R32 one end of which is connected to the reference power supply for supplying a fixed potential Vx, is added to the node between the resistance elements R30 and R31 (r20=r30+r31).

First, let us consider a case where the negative potential VBB0 reaches a desired detection level VBB. In either of the circuits, the potential VO supplied to the inverted input terminals (−) of the operational amplifiers OP20 and OP30 becomes equal to the reference potential Vref. In the circuit 30 shown in FIG. 5B, the resistance ratio of the element R30 to the element R31 is (Vref−Vx):(Vx−VBB). Since a potential difference between VO and VBB corresponds to (Vref−VBB), a voltage drop ΔV1 in the resistance element R30 is (Vref−Vx), a voltage drop ΔV2 in the resistance element R31 is (Vx−VBB), and a potential V1 at the node between the resistance elements R30 and R31 becomes equal to the fixed potential Vx. In other words, when VBB0=VBB, no potential difference occurs between both ends of the resistance element R32. It is thus understood that the newly added resistance element R32 does not influence a detection level at all.

Next, let us consider a case where the negative potential VBB0 decreases further and the potential VO supplied to the inverted input terminals of the operational amplifiers OP20 and OP30 reaches a GND level, with reference to FIGS. 6A and 6B. Like FIGS. 5A and 5B, these figures are circuit diagrams of the negative-potential detecting circuits of Mihara et al. and the present invention, respectively.

In the circuit 20 of Mihara et al. shown in FIG. 6A, the current I' supplied from the constant-current source 21 is Vref/r21 and the resistance r20 of the resistance element R20 is (1+(−VBB/Vref))·r21. It is thus understood that a voltage drop in the resistance element R20 is (Vref−VBB) and the negative potential VBB0 is (VBB−Vref). In other words, if the negative potential VBB0 decreases any more, the potential VO applied to the operational amplifier OP20 becomes negative. Such a case cannot be coped with the constant-current source 21 or the operational amplifier OP20, which is constituted of a transistor having a thin gate oxide.

In the circuit 30 of the present invention shown in FIG. 6B, a voltage drop ΔV1 in the resistance element R30 is given by (Vref−Vx) based on the following relationships: r30=(Vref−Vx)·r33/Vref and I =Vref/r33. Then, the potential V1 at the node between the resistance elements R30 and R31 is expressed as (Vx−Vref) since the potential VO is at the GND level. In other words, a potential difference corresponding to reference potential Vref occurs between both ends of the resistance element R32. If the resistance of the resistance element R32 is set to the same as that of the resistance element R33, the resistance element R32 generates current I that flows toward the node between the resistance elements R30 and R31. Thus, a combined current 2I of current I supplied from the constant-current source 31 and current I supplied from the resistance element R32 flows through the resistance element R31. The resistance r31 of the resistance element R31 is equal to (Vx−VBB) r33/Vref, and the current 2I , which is equal to 2Vref/r33, flows into the resistance element R31. A voltage drop ΔV2 in the resistance element R31 therefore corresponds to (Vx−VBB). Consequently, the negative potential VBB0 is given by (2VBB−Vref−Vx). In the circuit 30 of the present invention, the potential VO can be held positively even when the negative potential VBB0 lowers more highly than that in the circuit 20 of Mihara et al.

In the foregoing negative-potential detecting circuit, an external power supply Vcc can be used as it is. The number of power supplies for use in the circuit can thus be minimized and accordingly the circuit design and the breakdown-voltage increasing design can be simplified. Even though the negative potential VBBO lowers more highly than a desired potential VBB, the potential VO of a detection point can be held in a positive state. The constant-current source 31 and the operational amplifiers OP30 and OP31 can thus be constituted of MOS transistors having a thin gate oxide. Consequently, the circuit arrangement can be simplified, the operating current can be reduced, and the detection sensitivity can be improved.

Figure 7:
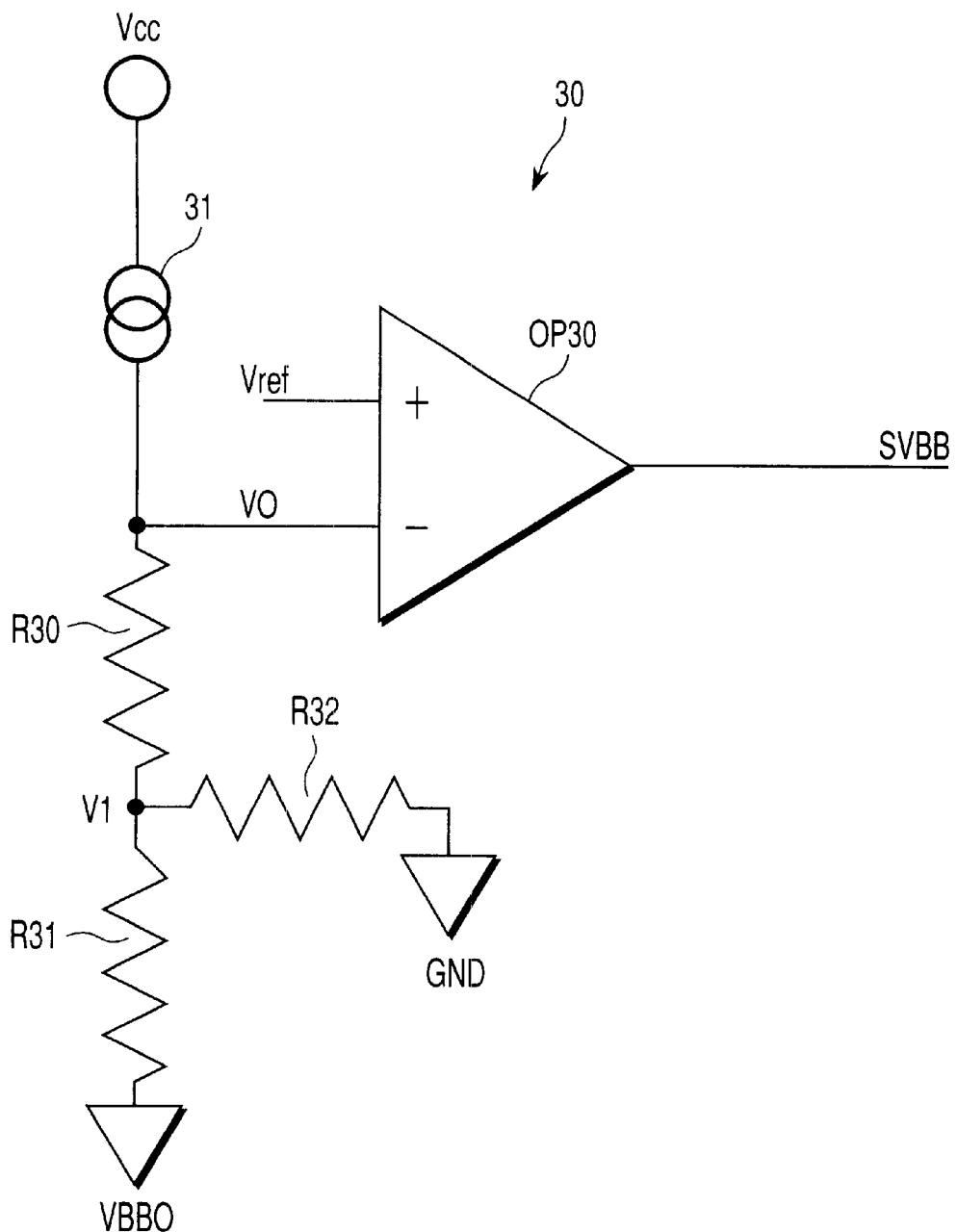
FIG. 7 is a circuit diagram of a negative-potential detecting circuit according to a second embodiment of the present invention.

A negative-potential detecting circuit according to a second embodiment of the present invention will now be described with reference to FIG. 7. FIG. 7 is a circuit diagram of the negative-potential detecting circuit.

Figure 8:
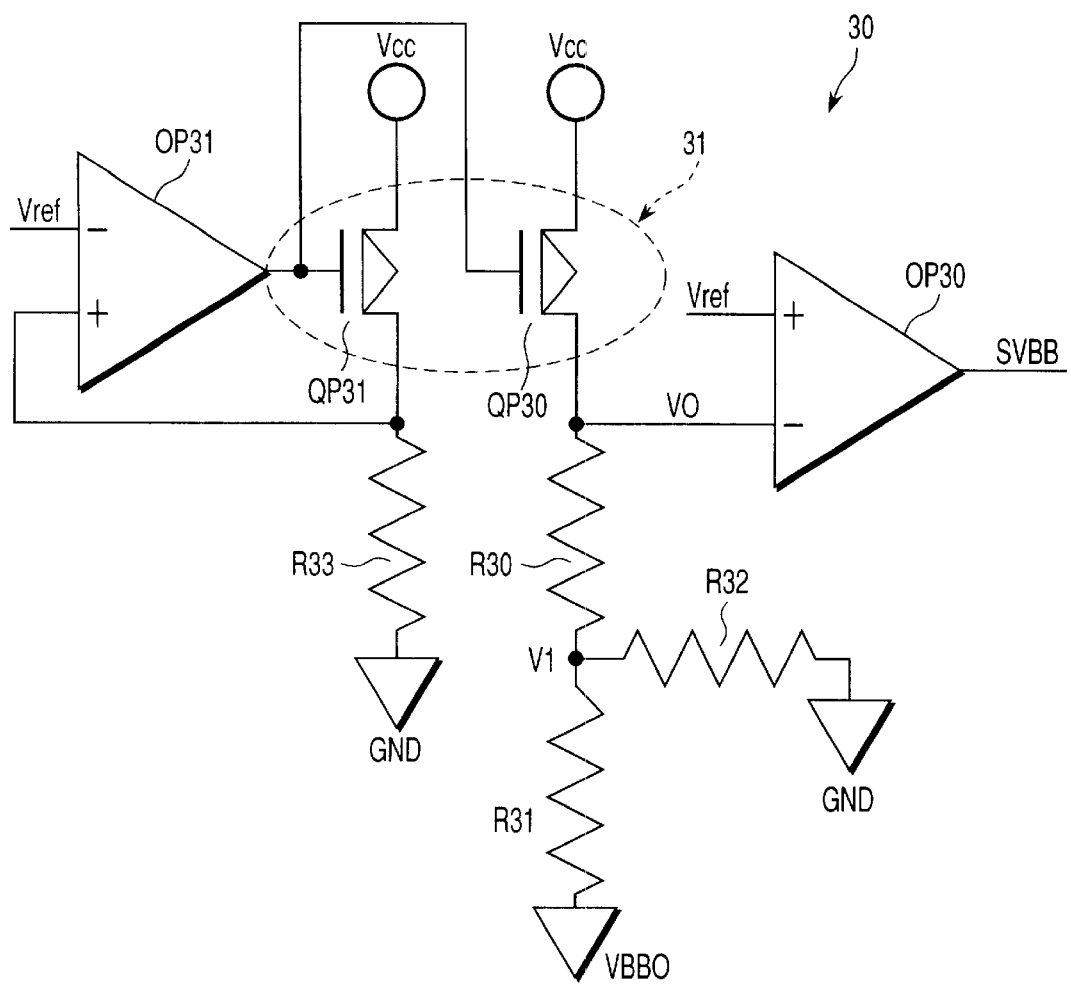
FIG. 8 is a specific circuit diagram of the negative-potential detecting circuit according to the second embodiment of the present invention.

In the second embodiment, a ground potential GND is substituted for the reference potential Vx of the negative-potential detecting circuit of the first embodiment shown in FIG. 3, as shown in FIG. 7. FIG. 8 is a specific circuit diagram of the negative-potential detecting circuit shown in FIG. 7. Since the circuit arrangement of the second embodiment is the same as that of the first embodiment except that a ground potential is substituted for the reference potential Vx, its description is omitted.

The ratio of resistance r30 of a resistance element R30 to resistance r31 of a resistance element R31 is set to Vref:−VBB. A constant-current source 31 supplies a constant current $\underline{I}$ (=Vref/r33). In other words, the resistance r30 of the resistance element R30 is equal to r33, while the resistance r31 of the resistance element R31 is equal to (−VBB/Vref)·r30. The constant current $\underline{I}$ is equal to Vref/r30. Needless to say, if the PMOS transistor QP30 can supply the constant current $\underline{I}$ obtained from the above equation, a circuit for controlling a value of the current $\underline{I}$ is not limited to the circuit arrangement shown in FIG. 8, as described in the first embodiment.

An operation of the negative-potential detecting circuit according to the second embodiment and its advantage will now be discussed as compared with those of the prior art circuit of Mihara et al. FIG. 9A is a circuit diagram of the negative-potential detecting circuit proposed by Mihara et al., while FIG. 9B is a circuit diagram of the negative-potential detecting circuit according to the second embodiment of the present invention. These figures show only the main parts of the circuits for the sake of simplification.

In the negative-potential detecting circuit 30 of the second embodiment, the resistance element R20 of the circuit 20 of Mihara et al. is divided into two resistance elements R30 and R31 having a resistance ratio of Vref:−VBB, and a resistance element R32 one end of which is connected to the ground potential GND, is added to a node between the resistance elements R30 and R31.

First, let us consider a case where the negative potential VBBO reaches a desired detection level VBB. In either of the circuits shown in FIGS. 9A and 9B, the potential VO applied to the inverted input terminal (−) of the operational amplifier (OP20, OP30) becomes equal to the reference potential Vref. In the circuit 30 shown in FIG. 9B, the resistance ratio of the resistance element R30 to the resistance element R31 is Vref:−VBB. Since a potential difference between VO and VBB corresponds to (Vref−VBB), a voltage drop ΔV1 in the resistance element R30 is Vref, a voltage drop ΔV2 in the resistance element R31 is −VBB, and a potential V1 at the node between the elements R30 and R31 is equal to the ground potential GND. In other words, when VBBO is equal to VBB (VBBO=VBB), no potential difference occurs between both ends of the resistance element R32. It is thus understood that the newly added resistance element R32 does not influence the detection level at all.

Next, let us consider a case where the negative potential VBBO lowers further and the potential VO applied to the inverted input terminal of the operational amplifier (OP20, OP30) becomes equal to a GND level. This case will be described with reference to FIGS. 10A and 10B. Like FIGS. 9A and 9B, FIGS. 10A and 10B are circuit diagrams illustrating the negative-potential detecting circuits of Mihara et al. and the second embodiment, respectively.

Figure 10A:
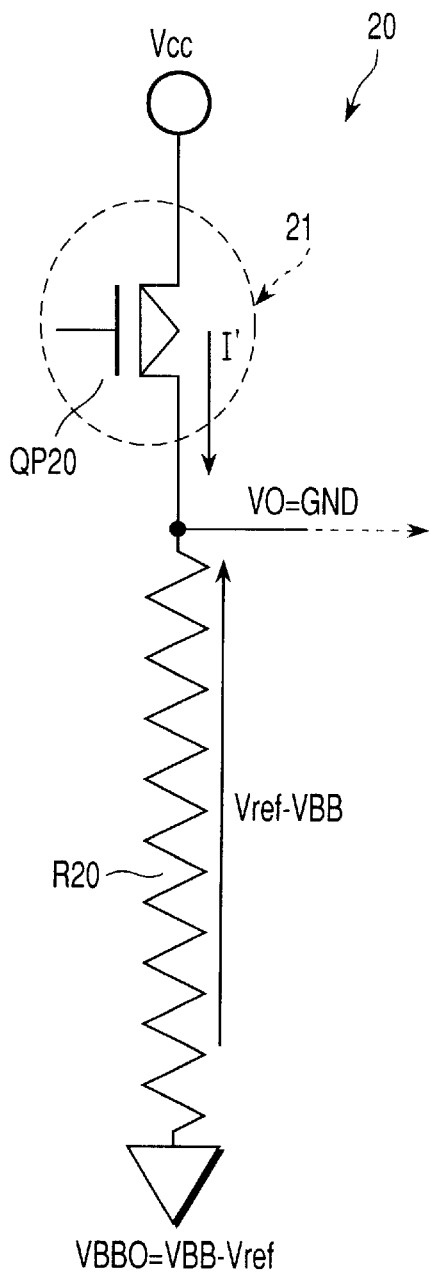

In the circuit 20 of Mihara et al. illustrated in FIG. 10A, when VO=GND, VBBO=VBB−Vref, as in the first embodiment.

Figure 10B:
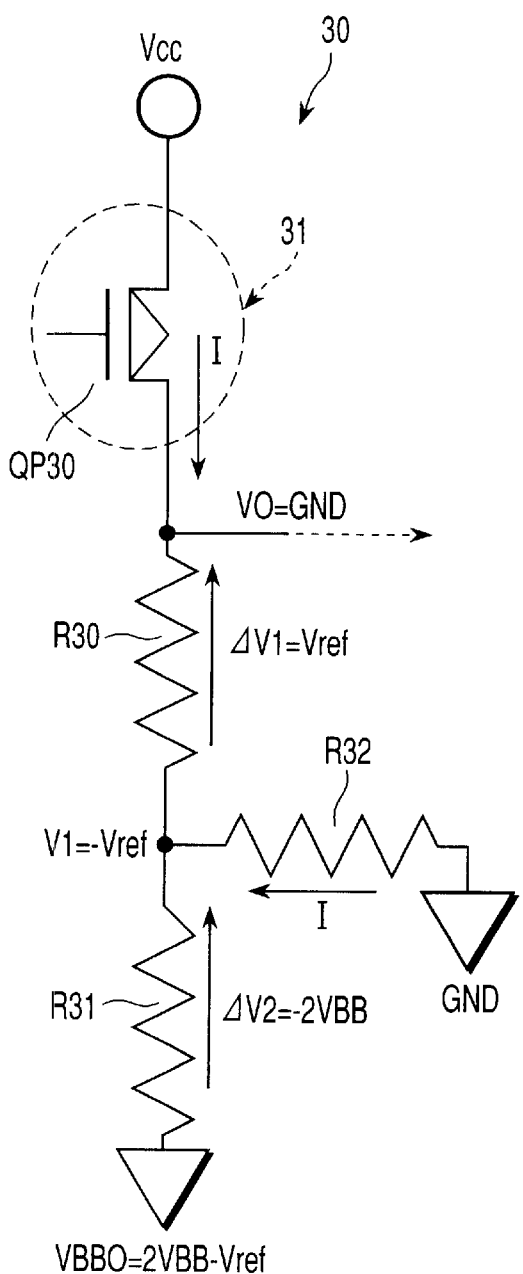

In the circuit 30 of the second embodiment shown in FIG. 10B, a voltage drop ΔV1 in the resistance element R30 is equal to Vref since r30=r33 and I=Vref/r30. Thus, the potential V1 at the node between the resistance elements R30 and R31 becomes equal to −Vref since VO is equal to GND. In other words, a potential difference of Vref occurs between both ends of the resistance element R32. If the resistance of the resistance element R32 is set to the same as that of the resistance element R33, the resistance element R32 generates current $\underline{I}$ that flows toward the node between the resistance elements R30 and R31. Thus, a combined current $2\underline{I}$ of current $\underline{I}$ supplied from the constant-current source 31 and current $\underline{I}$ supplied from the resistance element R32 flows through the resistance element R31. The resistance r31 of the resistance element R31 is −VBB·r33/Vref, and the current $2\underline{I}$ (=2Vref/r33) flows into the resistance element R31, with the result that a voltage drop ΔV2 in the resistance element R31 becomes equal to −2VBB. Consequently, the negative potential VBBO is equal to (2VBB−Vref). The potential VO in the circuit 30 of the second embodiment can be held positively even when the negative potential VBBO lowers more highly than that in the circuit 20 of Mihara et al.

The above negative-potential detecting circuit of the second embodiment can produce the same advantage as that of the first embodiment. Since the reference potential Vx is set equal to the ground potential GND, the circuit can be arranged more simply.

In the negative-potential detecting circuits according to the first and second embodiments, the resistance r32 of the resistance element R32 added to the node between the resistance elements R30 and R31 is equal to the resistance r33 of the resistance element R33. If, however, the resistance r32 lowers further, the circuit can cope with a more highly negative potential VBBO.

Figure 11A:
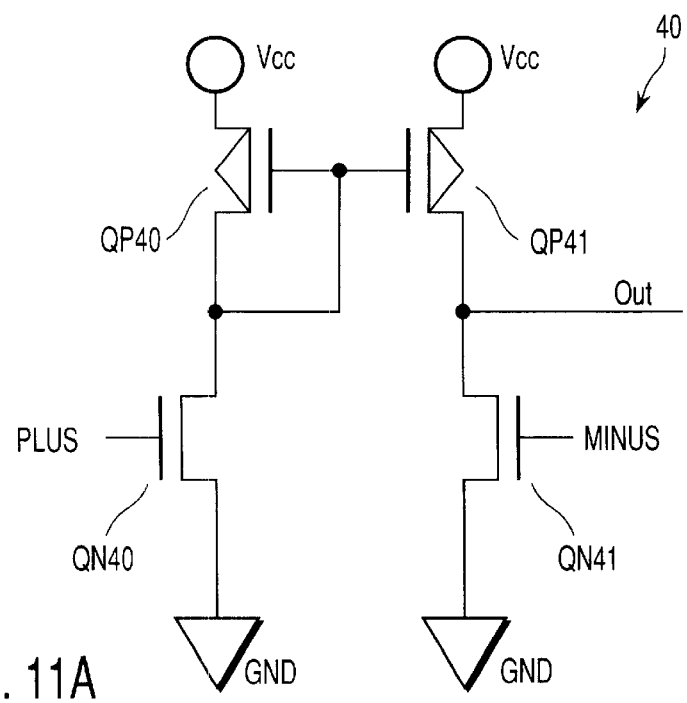
FIG. 11A is a circuit diagram of an operational amplifier each of the negative-potential detecting circuits according to the first and second embodiment of the present invention.

The addition of the resistance element R32 may slightly decrease the amplitude (ΔVO/ΔVBBO) of the detection node. However, this problem can be resolved by the use of a current-mirror operational amplifier 40 as shown in the circuit diagram of FIG. 11A.

The current mirror operational amplifier 40 includes a PMOS transistor QP40, an NMOS transistor QN40, a PMOS transistor QP41, and an NMOS transistor QN41. The PMOS transistor QP40 has a source connected to an external power supply Vcc and a gate and a drain short-circuited with each other. The NMOS transistor QN40 has a drain connected to that of the transistor QP40, a gate serving as a non-inverted input terminal (+), and a source connected to a ground potential. The PMOS transistor QP41 has a source connected to an external power supply Vcc and a gate connected to the gate of the transistor QP40. The NMOS transistor QN41 has a drain connected to that of the transistor QP41, a gate serving as an inverted input terminal (−), and a source connected to a ground potential. A node between the PMOS transistor QP41 and the NMOS transistor QN41 serves as an output node OUT. If a great-amplification-factor operational amplifier with the above structure is used as the operational amplifier OP30, no practical problems arise in detection precision as a matter of practicality.

Figure 11B:
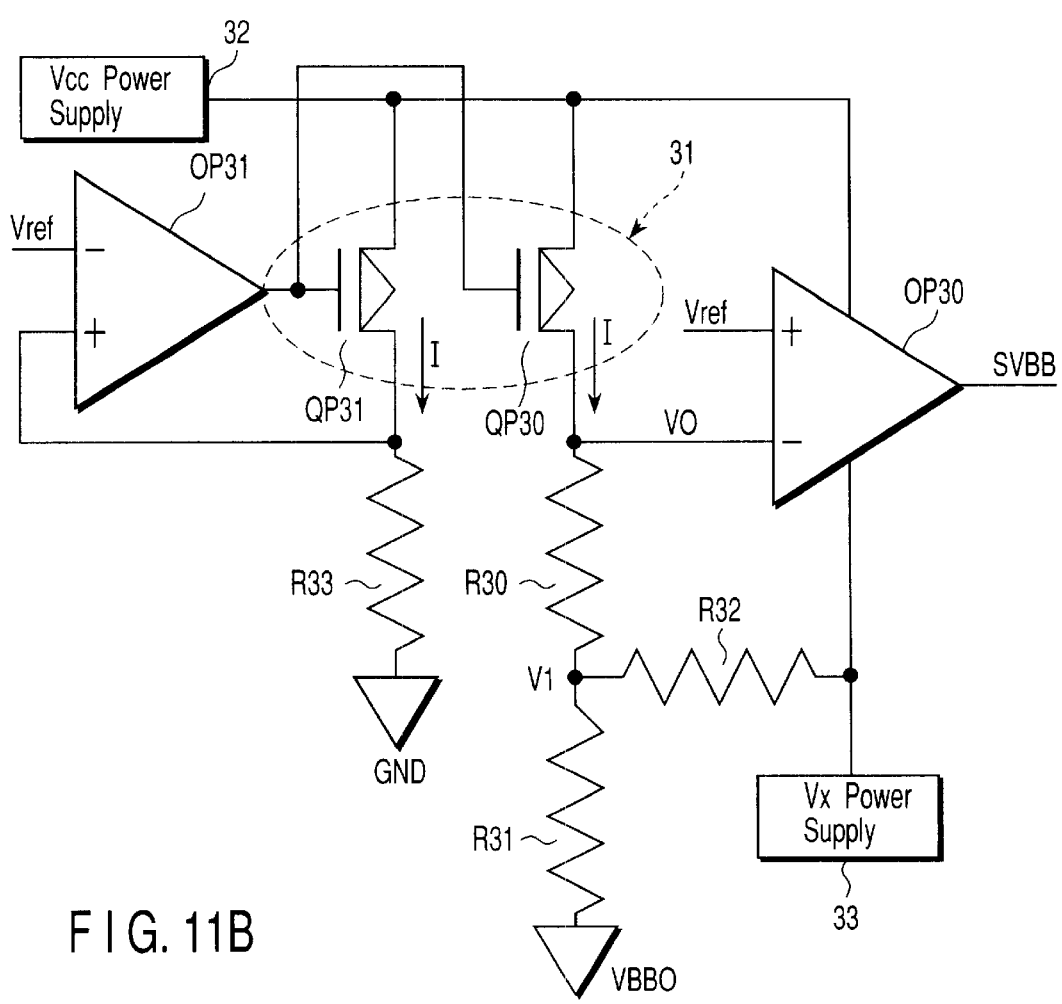
FIG. 11B is a circuit diagram according to a modification to the first and second embodiments of the present invention.

In the negative-potential detecting circuit shown in FIG. 11B, a common Vcc power supply 32 can supply a source potential to the PMOS transistors QP30 and QP31 and a high-level power supply potential to the comparator (operational amplifier) OP30. Similarly, a common Vx power supply 33 can supply a potential Vx to one end of the resistance element R32 and a low-level power supply potential to the comparator OP30. The use of the common power supplies can simplify the arrangement of the negative-potential detecting circuit. Though not shown in FIG. 11B, the Vcc power supply 32 and Vx power supply 33 can supply a high-level power supply potential and a low-level power supply potential to the comparator OP31, respectively.

In the foregoing embodiments, no potential difference occurs between both ends of the resistance element R32 when VBBO is equal to VBB. The circuit arrangement is not limited only to this condition. The current caused by the potential difference does not flow only into the resistance element R31 but can flow into the resistance element R32 from the node between the elements R31 and R32. This is because the relationship between the current and potential can be compensated by the relationship in resistance between the resistance elements R30 and R31. The same reference voltage Vref need not be always applied to the operational amplifiers OP30 and OP31, because the resistance can set the value of flowing current. Moreover, a resistor made of metal or semiconductor materials as well as a diffused resistor can be used if its resistance ranges from several tens of kilohms (kΩ) to several tens of megohms (kΩ)

A nonvolatile semiconductor memory device according to one embodiment of the present invention will now be described with reference to FIG. 12. FIG. 12 is a block diagram showing an example of the internal structure of a chip of a flash memory. This embodiment is directed to the application of the negative-potential detecting circuit of the first and second embodiments to a power supply system of a flash memory.

As FIG. 12 illustrates, a flash memory 50 comprises a memory cell array 51, an address buffer 52, a row decoder 53, a column decoder 54, a source decoder 55, an I/O control circuit 56, a column selector 57, a write circuit 58, a sense amplifier (S/A) 59, an I/O buffer 60, a command/user interface circuit 61, an internal control circuit 62, and an internal power supply/booster circuit 63.

The memory cell array 51 includes a plurality of bit lines BL and a plurality of word lines WL (only one bit line and only one word line are shown) and a plurality of memory cells (only one flash cell is shown) MC each having a floating gate, a control gate, a source and a drain. In each memory cell MC, electrons are injected into the floating gate to vary a threshold voltage viewed from the control gate, with the result that data is programmed (written) and electrically erased. The control gate of each memory cell MC is connected to one of the word lines WL, and the drain thereof is connected to one of the bit lines BL. The source of each memory cell MC is connected to a common source line (not shown) in units of bit lines, word lines or blocks.

The address buffer 52 receives an address signal from outside and generates an internal address signal. The internal address signal is then supplied to the row decoder 53, column decoder 54 and source decoder 55.

The I/O control circuit 56 receives a chip enable signal $\overline{CE}$, a write enable signal $\overline{WE}$ and an output enable signal $\overline{OE}$ from outside and generates various types of control signals for controlling an operation of internal circuits in response to these signals. For example, a control signal generated in response to the chip enable signal $\overline{CE}$ is supplied to the address buffer 52 to allow the address buffer 52 to issue an internal address signal. A control signal generated in response to the output enable signal $\overline{OE}$ is supplied to the I/O buffer 60, which will be described later, to allow the I/O buffer 60 to output data. A control signal generated in response to the write enable signal $\overline{WE}$ is supplied to the write circuit 58 to allow the write circuit 58 to write data.

The row decoder 53 selects a word line WL in the memory cell array 51 in response to the above internal address signal (internal row address signal).

The column selector 57 selects a bit line BL in the memory cell array 51 in response to the output from the column decoder 54.

The source decoder 55 selects a source line in the memory cell array 51 in response to the above internal address signal and supplies a predetermined voltage to the selected source line.

The write circuit 58 supplies write data to a selected memory cell of the memory cell array 51 and writes data thereto.

The sense amplifier (S/A) 59 amplifies data read out of a selected memory cell of the memory cell array 51.

The I/O buffer 60 supplies data to the write circuit 58 from outside in write mode and outputs the data amplified by the sense amplifier circuit 59 in read mode. The I/O buffer 60 is supplied with command data for setting operation modes for writing, erasing and reading data and product modes for marketing various types of products having a plurality of modes.

The command/user interface circuit 61 is connected to the I/O buffer 60. This circuit 61 is supplied with the control signals from the I/O control circuit 56. The circuit 61 receives the command data from the I/O buffer 60 at the time when the write enable signal $\overline{WE}$ is activated. The output of the circuit 61 is supplied to the internal control circuit 62. The circuit 62 thus generates an internal control signal corresponding to the command data received by the circuit 61. The internal control signal is then supplied to the internal power supply/booster circuit 63.

The above circuit 63 receives a power supply voltage from outside and generates an internal power supply voltage therefrom. The circuit 63 also generates a boost voltage using a charge pump. The internal power supply voltage and boost voltage are generated in response to the internal control signal and distributed to respective circuits of one chip.

The power supply system of the nonvolatile semiconductor memory will now be described specifically. Prior to the description, the relationship between the operating voltages of a control gate (Vg), a drain (Vd) and a source (Vs) of a memory cell and the write, erase and read modes will be discussed with reference to FIG. 13. In the write mode, boost potentials of 8V, 5V and 0V are applied to the gate (word line WL), drain and source, respectively, and hot electrons generated between the drain and source are injected into a floating gate. In the erase mode, the drain is open, boost potentials of −7V and 5 V are applied to the gate (word line WL) and source, respectively, and electrons are ejected by FN (Fowler-Nordheim) tunneling by generating a high voltage between the floating gate and the source. In the read mode, boost potentials of 5V and 0V are applied to the word line WL and the source, respectively, and the current flowing through the memory cell is sensed by the sense amplifier S/A.

Figure 14:
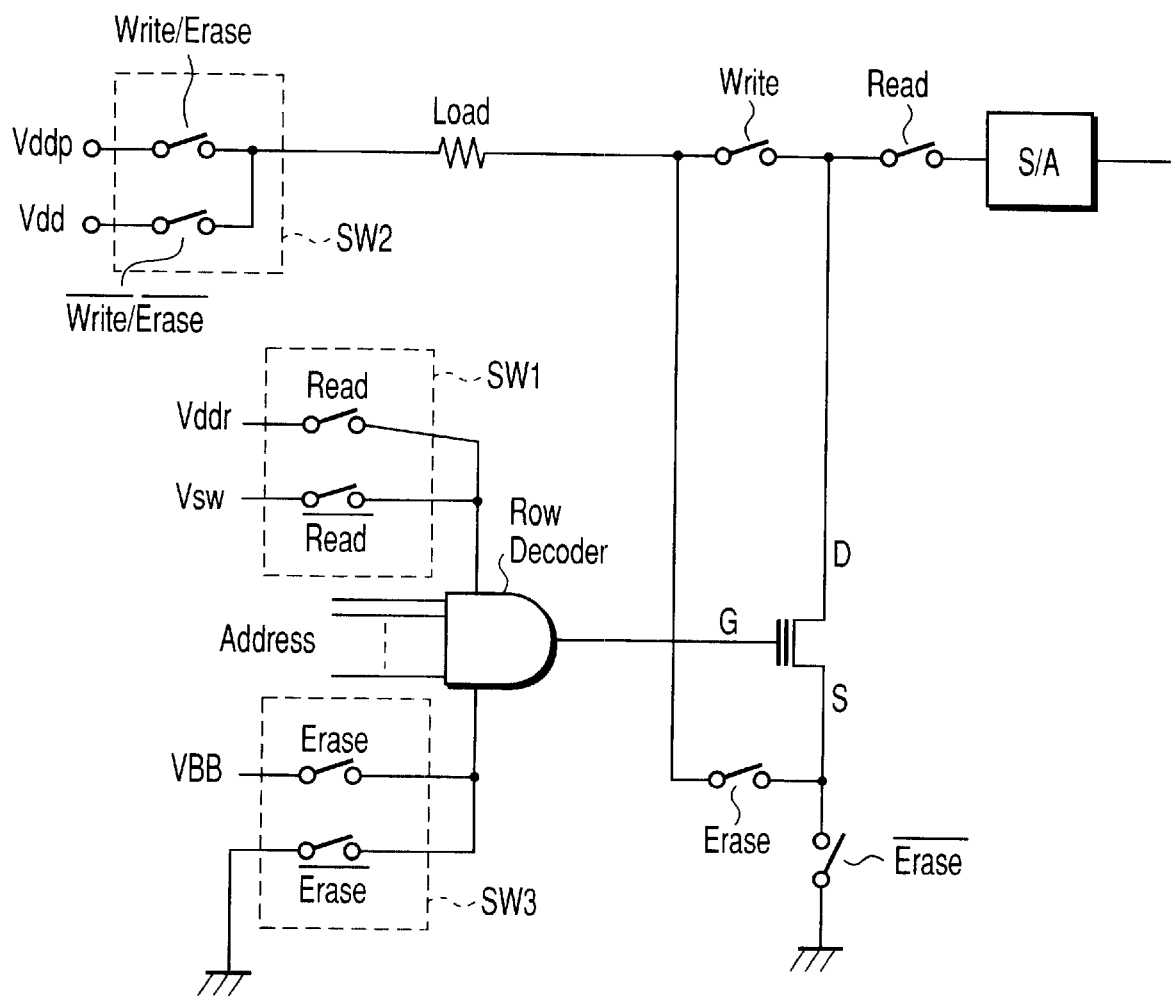
FIG. 14 is a circuit diagram of a voltage-applying system of the nonvolatile semiconductor memory according to the one embodiment of the present invention.

FIG. 14 is a circuit diagram schematically showing a voltage-applying system when data is written to, erased from and read out of the memory cell. The word lines WL of the memory cell are driven by the row decoder. A high-potential level of the row decoder is set at 5V (=Vddr) in the read mode and 8V (=Vsw) in the write mode by means of a switch SW1. On the other hand, a low-potential level is set at −7 V (=VBB) by means of a switch SW3. Thus, 5V, 8V and −7V are applied to the word line WL or the gate G of the memory cell in the read, write and erase modes, respectively.

The drain D of the memory cell is connected to the sense amplifier in the read mode, and a 1V-voltage is applied through the sense amplifier. In the write mode, the drain D is connected to a load LOAD in the write mode, and a 5V-voltage is applied through the load LOAD. In the erase mode, the drain D is open.

A 5V-voltage is applied to the source S of the memory cell via the load LOAD in the erase mode, and the source S is grounded in the other modes. The load LOAD is connected to Vdd and charge pump output Vddp by means of a switch SW2.

FIG. 15 is a circuit diagram showing an example of the arrangement of a reading power supply 70a and a writing/erasing power supply 70b for supplying power supply voltages Vddr, Vsw, Vddp and VBB as shown in FIG. 14.

The reading and writing/erasing power supplies 70a and 70b generate each potentials having a desire level based on a reference potential generated from a reference potential generating circuit 71 using, e.g., a band gap reference (BGR) circuit. Such a potential is generated in the following three cases:

(1) A charge pump circuit turns on/off;
(2) The output of the charge pump circuit in the case (1) is controlled by a regulator; and
(3) The output and the constant potential (e.g., VSS) of the charge pump circuit in the case (1) are switched to each other.

In FIG. 15, both a power supply line 72a (Vddr) of the reading power supply 70a and a power supply line 72b-2 (Vddp) of three power supply lines 72b-1 to 72b-3 of the writing/erasing power supply 70b correspond to the above case (1). More specifically, the power supply line 72a includes a power supply control circuit 73 and a charge pump circuit (CP) 75a (first charge pump circuit), while the power supply line 72b-2 includes a power supply control circuit 74-2 and a charge pump circuit (CP) 75b-2 (fourth charge pump circuit). The power supply control circuits 73 and 74-2 each control an on/off state of the charge pump circuit. The charge pump circuits 75a and 75b-2 are controlled by the power supply control circuits to generate a positive potential. These power supply control circuits drive their respective charge pump circuits when the level of a power supply voltage is not higher than a desired level, and they stop their respective charge pump circuits from operating when the level reaches a desired level.

The writing/erasing power supply line 72b-1 (Vsw) corresponds to the above case (2). The power supply line 72b-1 includes a power supply control circuit 74-1, a charge pump circuit (CP) 75b-1 (third charge pump circuit), and a regulator control circuit 76. The power supply control circuit 74-1 controls an on/off state of the charge pump circuit. The charge pump circuit 75b-1 is controlled by the power supply control circuit 74-1 to generate a positive potential. The regulator control circuit 76 controls an output level VCP of the charge pump circuit (CP) 75b-1. More specifically, the writing/erasing power supply 72b-1 is used for repeating an automatic data writing operation and a verify data reading operation using an 8V-write voltage and a 6.5 V-verify read voltage. The regulator control circuit 76 is used for controlling such voltages.

The writing/erasing power supply line 72b-3 (VBB) corresponds to the above case (3). The power supply line 72b-3 includes a power supply control circuit 74-3, a charge pump circuit (NCP) 75b-3 (second charge pump circuit), and a switching circuit (SW) 77. The power supply control circuit 74-3 controls an on/off state of the charge pump circuit. The charge pump circuit 75b-3 is controlled by the power supply control circuit 74-3 to generate a negative potential. The switching circuit (SW) 77 switches an output VCP of the charge pump circuit (NCP) 75b-3. The switching circuit (SW) 77 is provided in order to output a potential VSS while the charge pump circuit (NCP) 75b-3 is not operating.

The above writing/erasing power supply 70b having three power supply lines is activated in accordance with a write/erase operation mode in response to an auto-control signal output from a write-state machine 78.

Figure 16:
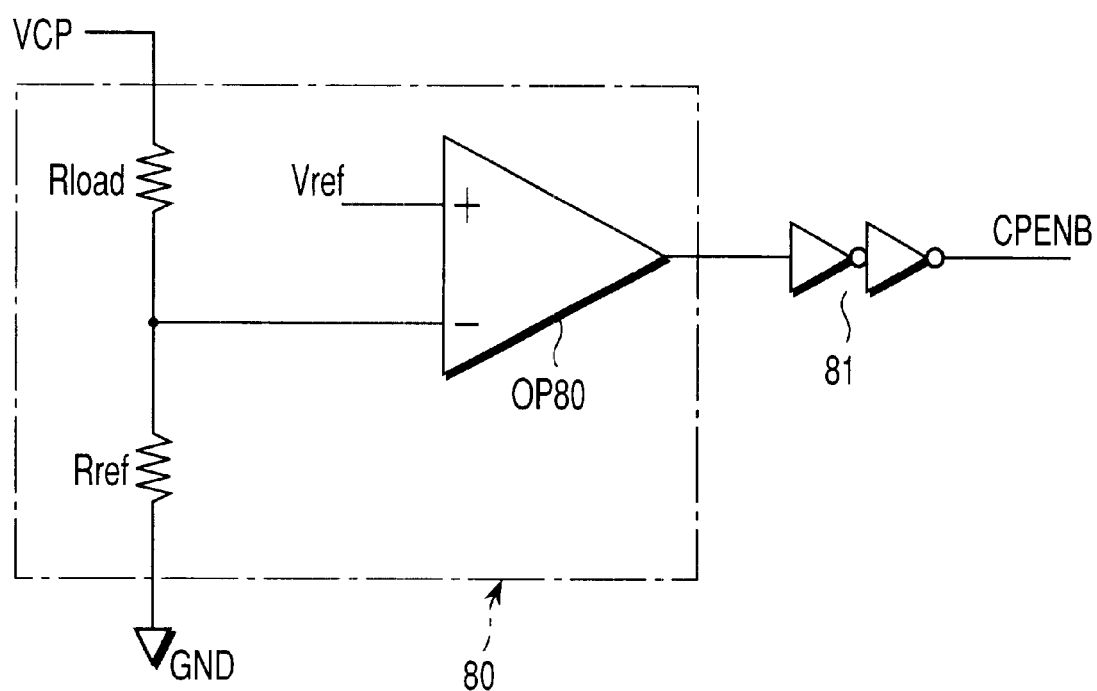
FIG. 16 is a circuit diagram of a power supply control circuit of a charge pump circuit for generating a positive potential in the nonvolatile semiconductor memory according to the one embodiment of the present invention.

FIG. 16 is a circuit diagram showing an example of the arrangement of the power supply control circuits 73, 74-1 and 74-2 for controlling an on/off state of the charge pump circuits (CP) 75a, 75b-1 and 75b-2 for generating a positive potential, shown in FIG. 15. As FIG. 16 shows, the power supply control circuit includes a positive-potential detecting circuit 80 and a buffer 81 for receiving an output from the circuit 80. The circuit 80 has two resistance elements Rload and Rref and an operational amplifier OP80. The resistance elements Rload and Rref are connected in series between a ground potential GND and a positive potential VCP generated from the charge pump circuits (CP) 75a, 75b-1 and 75b-2. The operational amplifier OP80 has an inverted input terminal (−) receiving a potential from a node between the two resistance elements Rload and Rref and a non-inverted input terminal (+) receiving a reference potential Vref.

In the positive-potential detecting circuit 80, the positive potential VCP is divided by a potential-dividing circuit of the resistance elements Rload and Rref, and a potential obtained by the potential-dividing circuit is compared with the reference potential Vref in the operational amplifier OP80. An output of the operational amplifier OP80 is supplied as a charge pump enable signal CPENB through the buffer 81. The charge pump enable signal CPENB drives the charge pump circuit CP when the positive potential VCP is lower than a desired voltage and stops the charge pump circuit CP from operating when VCP reaches a desired voltage.

FIG. 17 is a circuit diagram of the regulator control circuit 76 shown in FIG. 15. The regulator control circuit 76 includes NMOS transistors QN90 and QN91, PMOS transistors QP90 and QP91, and two operational amplifiers OP90 and OP91. The NMOS and PMOS transistors are constituted as a differential circuit for controlling the level of a potential VCP output from the charge pump circuit (CP) 75b-1 and outputting the level-controlled potential. The operational amplifiers control the gate potentials of the NMOS transistors QN90 and QN91 in accordance with the output level. The output level is monitored as a divided output of the resistance elements Rload and Rref, and the divided output is fed back to the operational amplifiers OP90 and OP91, thereby obtaining a desired voltage level. The resistance of the resistance element Rload can be changed by a switch 90 that is controlled in response to mode signals MODE1 to MODE 4. Thus, a required power supply level is controlled.

Figure 18:
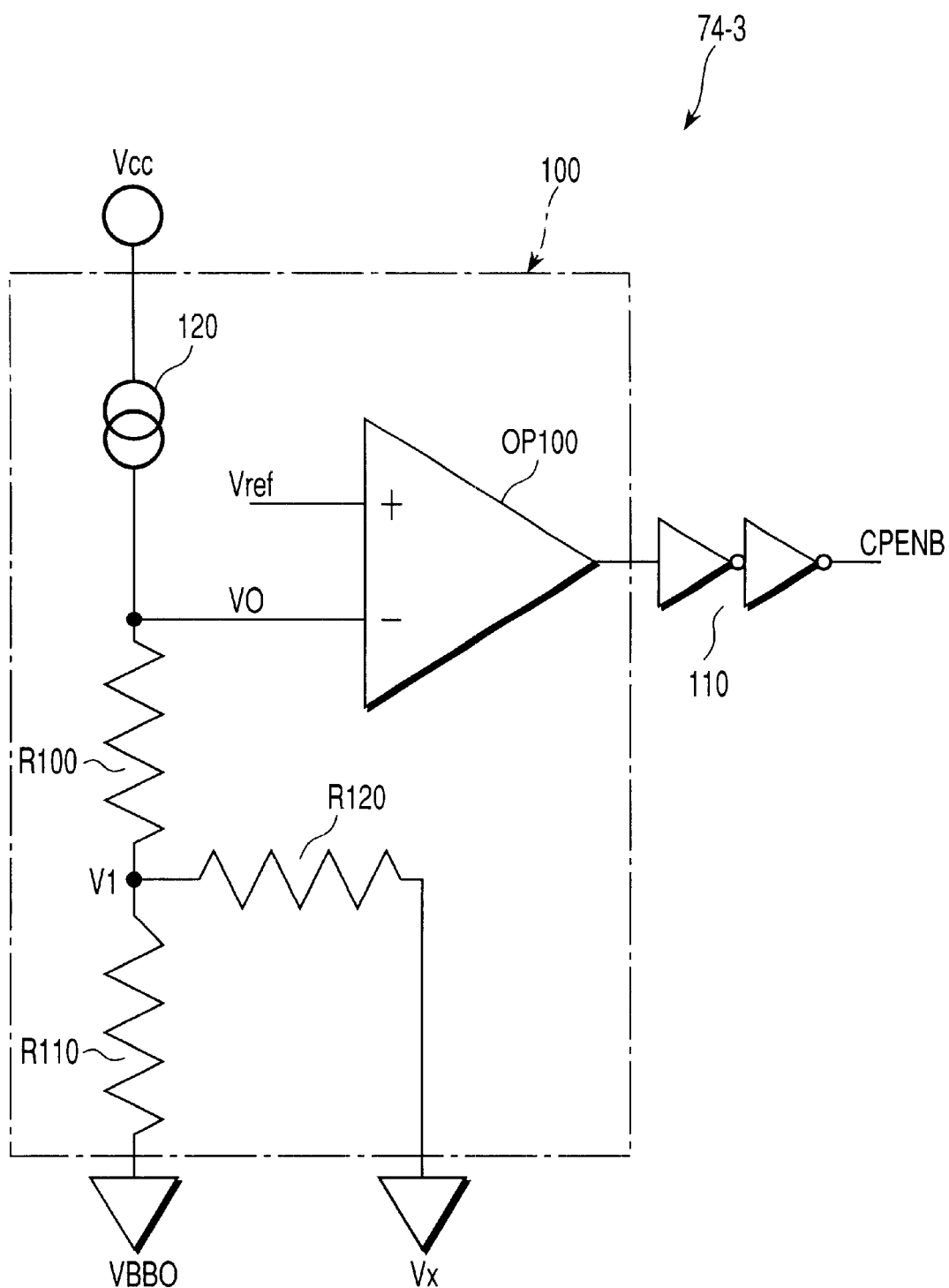
FIG. 18 is a circuit diagram of a power supply control circuit of a charge pump circuit for generating a negative potential in the nonvolatile semiconductor memory according to the one embodiment of the present invention.

The arrangement of the power supply control circuit 74-3, which controls the on/off state of the charge pump circuit (NCP) 75b-3 for generating a negative potential as shown in FIG. 15, will now be described with reference to FIG. 18. FIG. 18 is a circuit diagram of the power supply control circuit 74-3.

The power supply control circuit 74-3 comprises a negative-potential detecting circuit 100 and a buffer 110 receiving an output from the circuit 100. As FIG. 18 shows, the negative-potential detecting circuit 100 includes a constant-current source 120, a first resistance element R100, a second resistance element R110 (which constitutes a potential-dividing circuit together with the first resistance element R100), a third resistance element (potential control circuit) R120, and an operational amplifier (first comparator) OP100. The constant-current source 120 outputs a constant current $I$ upon receipt of an external power supply voltage Vcc. One end of the first resistance element R100 is connected to an output terminal of the constant-current source 120. One end of the second resistance element R110 is connected to the other end of the first resistance element R100, and the other end thereof is connected to a negative potential VBBO.

One end of the third resistance element R120 is connected to a node between the first and second resistance elements R100 and R110, and the other end thereof is connected to a fixed potential Vx (second reference potential). The operational amplifier OP100 has an inverted input terminal (−) connected to a node between the constant-current source 120 and the first resistance element R100 and a non-inverted input terminal (+) connected to a reference power supply for generating a fixed potential Vref (first reference potential).

The negative potential VBBO corresponds to a negative potential VCP that is generated from the charge pump circuit (NCP) 75b-3.

Assuming that the negative potential VBBO is equal to VBB (detection level), the ratio of resistance r100 of the resistance element R100 to resistance r110 of the resistance element R110 is set to (Vref−Vx):(Vx−VBB). The operational amplifier OP100 compares a potential VO of the node between the first resistance element R100 and the constant-current source 120 with the reference potential Vref and outputs a comparison result. The operational amplifier OP100 outputs a charge pump enable signal CPENB through the buffer 110.

Figure 19:
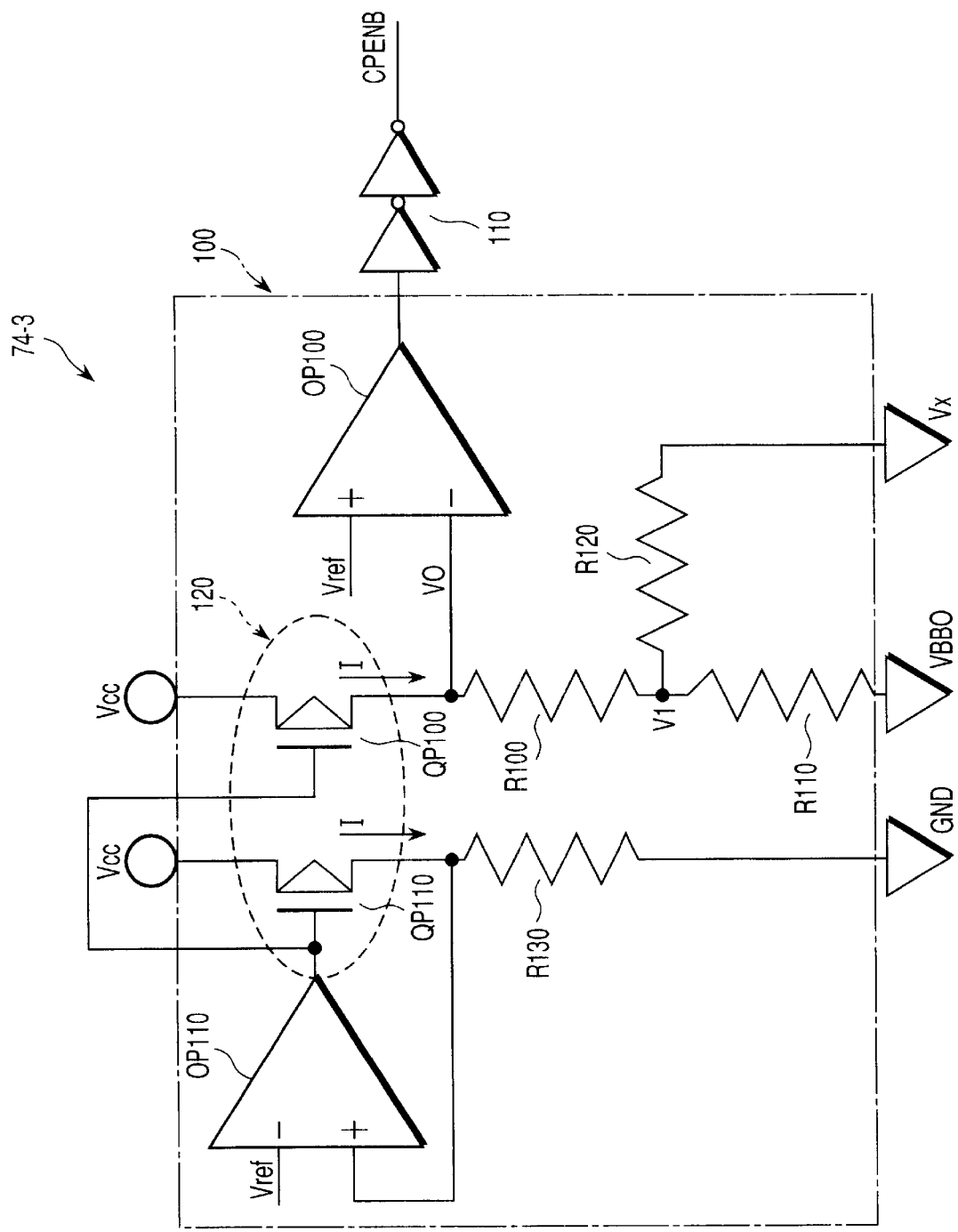
FIG. 19 is a specific circuit diagram of the power supply control circuit shown in FIG. 18 in the nonvolatile semiconductor memory according to the one embodiment of the present invention.

FIG. 19 is a specific circuit diagram of the negative-potential detecting circuit 100 of the power supply control circuit 74-3 shown in FIG. 18. The arrangement of the negative-potential detecting circuit 100 will now be described in detail.

As FIG. 19 shows, the constant-current source 120 is a PMOS transistor (first MOS transistor) QP100 having a source connected to an external power supply Vcc and a drain serving as an output terminal of current $I$. The negative-potential detecting circuit 100 also includes a PMOS transistor (second MOS transistor) QP110, a fourth resistance element R130, and an operational amplifier (second comparator) OP110. The PMOS transistor QP110, fourth resistance element R130, and operational amplifier OP110 serve as a circuit for controlling a value of the constant current supplied from the PMOS transistor QP100. The PMOS transistor QP110 has a source connected to an external power supply Vcc. One end of the fourth resistance element R130 is connected to the drain of the PMOS transistor QP110 and the other end thereof is connected to a ground potential. The operational amplifier OP110 has an inverted input terminal (−) connected to a reference power supply for generating a fixed potential Vref and a non-inverted input terminal (+) connected to a node between the drain of the PMOS transistor QP110 and the fourth resistance element R130. The output of the operational amplifier OP110 controls the gate potentials of the PMOS transistors QP110 and QP100.

The PMOS transistor QP110 is also a constant-current source and supplies a constant current $I$ of Vref/r130 if the resistance of the resistance element R130 is r130. The PMOS transistor QP100 supplies the same constant current $I$ (=Vref/r33). As described above, the resistance ratio of the resistance element R100 to the resistance element R110 is (Vref−Vx):(Vx−VBB) and the constant current $I$ supplied from the constant-current source 120 is Vref/r130. Thus, the resistances r100 and r110 of the resistance elements R100 and R110 are expressed by the following equations:

$$r100 = (Vref - Vx) \cdot r130 / Vref$$
$$r110 = (Vx - VBB) \cdot r130 / Vref$$
$$= (Vx - VBB) \cdot r100 / (Vref - Vx)$$

The constant current $I$ is expressed as follows:

$$I = Vref/r130 = (Vref - Vx)/r100$$

Since the operation of the above negative-potential detecting circuit is the same as that of the circuits of the first and second embodiments, its description is omitted. Needless to say, if the PMOS transistor QP100 can supply the constant current $I$ obtained from the above equation, a circuit for controlling a value of the current $I$ is not limited to the circuit arrangement shown in FIG. 19.

With the circuit arrangement described above, the power supply control circuit 74-3 constantly receives a negative potential VBBO (VCP) from the charge pump circuit 75b-3 and monitors it. If the negative potential VBBO is lower than a desired potential VBB, the circuit 74-3 outputs a CPENB signal for driving the circuit 75b-3. When VBBO is equal to VBB (VBBO =VBB), the circuit 74-3 stops the circuit 75b-3 from operating.

If, as described above, the negative-potential detecting circuits according to the first and second embodiments are used to control a flash memory, especially a charge pump circuit for generating a negative potential to be applied to a floating gate in cell erase mode, the charge pump circuit can be improved in operation precision.

A flash EEPROM (Electrically Erasable Programmable Read Only Memory) is taken as an example of the semiconductor device according to the first and second embodiments. It is however needless to say that the present invention is not limited to the flash EEPROM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A negative-potential detecting circuit comprising:
   a constant-current source;
   a first resistance element having one end connected to an output node of the constant-current source and another end;
   a second resistance element having one end connected to said another end of the first resistance element and another end connected to a negative-potential node whose potential is to be detected;

a first comparator having one input terminal connected to a connection node between the constant-current source and the first resistance element, another input terminal connected to a first reference potential node setting a detection level of a potential of the negative-potential node, and an output terminal, which compares a potential of the connection node and a first reference potential of the first reference potential node with each other to determine a voltage level of the negative-potential node; and a third resistance element having one end connected to a connection node of each of the first and second resistance elements and another end connected to a second reference potential node.

2. The negative-potential detecting circuit according to claim 1, wherein the constant-current source generates current $I$ that is expressed by:

$$I=(Vref-Vx)/r1$$

where r1 is a resistance of the first resistance element, Vref is the first reference potential of the first reference potential node, and Vx is a second reference potential of the second reference potential node.

3. The negative-potential detecting circuit according to claim 1, wherein a resistance ratio between the first and second resistance elements is expressed by:

$$r1:r2=(Vref-Vx):(Vx-VBB)$$

where r1 and r2 are resistances of the first and second resistance elements, respectively, Vref is the first reference potential of the first reference potential node, Vx is a second reference potential of the second reference potential node, and VBB is the detection level of the negative-potential node.

4. The negative-potential detecting circuit according to claim 1, wherein the second reference potential node has a second reference potential that is equal to a ground potential.

5. The negative-potential detecting circuit according to claim 1, wherein the second reference potential node has a second reference potential that is equal to a low-level power supply potential in the first comparator, and a reference potential power supply generating the second reference potential is used as a power supply generating the low-level power supply potential in the first comparator.

6. The negative-potential detecting circuit according to claim 1, wherein the constant-current sources receives a positive voltage from an external power supply, and the external power supply is used as a power supply generating the high-level power supply potential in the first comparator.

7. The negative-potential detecting circuit according to claim 1, wherein the constant-current source includes a first MOS transistor having a source connected to an external power supply, a gate having a fixed potential between the source and the gate, and a drain serving as a current output node.

8. The negative-potential detecting circuit according to claim 7, further comprising a second comparator which controls the first MOS transistor so as to maintain the fixed potential between the source and the gate thereof.

9. The negative-potential detecting circuit according to claim 8, further comprising:

a second MOS transistor having a source connected to the external power supply, a gate connected to an output node of the second comparator, and a drain connected to one input terminal of the second comparator; and a fourth resistance element having one end connected to the drain of the second MOS transistor and another end connected to a ground potential node, wherein the second comparator has another input terminal connected to a third reference potential node and an output terminal connected to the gate of the second MOS transistor and the gate of the first MOS transistor.

10. The negative-potential detecting circuit according to claim 9, wherein a resistance ratio between the first and fourth resistance elements is expressed by:

$$r1:r4(Vref-Vx):Vref3$$

where r1 and r4 are resistances of the first and fourth resistance elements, respectively, Vref is the first reference potential of the first reference potential node, Vx is a second reference potential of the second reference potential node, and Vref3 is a third reference potential of the third reference potential node.

11. The negative-potential detecting circuit according to claim 10, wherein the first and third reference potentials are substantially equal to each other.

12. A negative-potential detecting circuit comprising:

a constant-current source;

a potential-dividing circuit having one end connected to the constant-current source and another end connected to a negative-potential to be detected, which divides a potential difference between an output terminal of the constant-current source and the negative-potential node to generate a divided potential;

a comparator for comparing a potential of a detection node between the potential-dividing circuit and the constant-current source and a first reference potential setting a detection level with each other to determine a level of a negative potential of the negative-potential node; and a potential control circuit having one end connected to an output node of the potential-dividing circuit outputting the divided potential and another end connected to a second reference potential, which controls a potential of the output node of the potential-dividing circuit to hold the potential of the detection node at a positive value when the negative potential varies.

13. The negative-potential detecting circuit according to claim 12, wherein the potential control circuit controls the potential of the output node of the potential-dividing circuit by current caused by a potential difference between the divided potential and the second reference potential.

14. A semiconductor memory device comprising:

a booster circuit which receives a power supply voltage from outside, generates a negative boost potential used for at least one of writing, reading, and erasing of stored data of a memory cell array in response to an internal control signal, and applies the negative boost potential to any one of a row decoder, a column decoder, and a source decoder; and a control circuit which controls the negative boost potential applied to any one of the row decoder, the column decoder, and the source decoder from the booster circuit, the control circuit including a negative-potential detecting circuit, wherein the negative-potential detecting circuit includes:

a constant-current source;

a first resistance element having one end connected to an output node of the constant-current source;

a second resistance element having one end connected to another end of the first resistance element and another end connected to a negative boost potential node whose potential is to be detected;

a comparator having one input terminal connected to a connection node between the constant-current source and the first resistance element and another input terminal connected to a first reference potential node setting a detection level of the negative boost potential, which compares a potential of the connection node and a first reference potential of the first reference potential node with each other to determine a voltage level of the negative boost potential node; and a third resistance element having one end connected to a connection node of each of the first and second resistance elements and another end connected to a second reference potential node.

15. The semiconductor memory device according to claim 14, wherein the booster circuit comprises:

a first charge pump circuit which generates a positive boost potential for reading the stored data; and a second charge pump circuit which generates the negative boost potential used for one of writing and erasing of the stored data; and the negative-potential detecting circuit which drives the second charge pump circuit when the negative boost potential is higher than a predetermined value and stops the second charge pump circuit when the negative boost potential is lower than a predetermined value.

16. The semiconductor memory device according to claim 15, wherein the booster circuit further comprises a switching circuit provided at an output terminal of the second charge pump circuit, which switches a negative boost potential output from the second charge pump circuit and a third reference potential to each other, the switching circuit outputting the third reference potential while the second charge pump circuit stops operating.

17. The semiconductor memory device according to claim 14, wherein the booster circuit comprises:

a third charge pump circuit which generates a positive boost potential used for one of writing and erasing of the stored data; and a regulator which generates first and second potentials based on the positive boost potential output from the third charge pump circuit, wherein the first and second potentials generated from the regulator are used alternately to repeat an automatic data writing operation of writing data to a memory cell of the memory cell array and a verify data reading operation of reading data therefrom.

18. The semiconductor memory device according to claim 14, wherein the booster circuit comprises a fourth charge pump circuit which generates a positive boost potential used for one of writing and erasing of the stored data.

19. The semiconductor memory device according to claim 14, wherein the memory cell array includes a memory cell that is a nonvolatile memory cell.

* * * * *